United States Patent [19]
Merryman et al.

[11] Patent Number: 5,864,487
[45] Date of Patent: Jan. 26, 1999

[54] METHOD AND APPARATUS FOR IDENTIFYING GATED CLOCKS WITHIN A CIRCUIT DESIGN USING A STANDARD OPTIMIZATION TOOL

[75] Inventors: Kenneth E. Merryman, Fridley; Kevin C. Cleereman, Moundsview; Kenneth L. Engelbrecht, Blaine, all of Minn.

[73] Assignee: Unisys Corporation, Blue Bell, Pa.

[21] Appl. No.: 752,616

[22] Filed: Nov. 19, 1996

[51] Int. Cl.[6] ............................................ G06F 17/50
[52] U.S. Cl. ............................................ 364/491; 364/188
[58] Field of Search ................................ 364/488, 490, 364/491, 489, 578; 395/551, 555

[56] References Cited

U.S. PATENT DOCUMENTS

| | | | |
|---|---|---|---|
| 4,758,953 | 7/1988 | Morita et al. | 364/300 |
| 4,831,543 | 5/1989 | Mastellone | 364/489 |
| 4,918,614 | 4/1990 | Modarres et al. | 364/490 |
| 5,050,091 | 9/1991 | Rubin | 364/488 |
| 5,164,908 | 11/1992 | Igarashi | 364/491 |
| 5,175,696 | 12/1992 | Hooper et al. | 364/489 |
| 5,222,029 | 6/1993 | Hooper et al. | 364/489 |
| 5,255,363 | 10/1993 | Seyler | 395/164 |
| 5,267,175 | 11/1993 | Hooper | 364/489 |
| 5,341,309 | 8/1994 | Kawata | 364/489 |
| 5,349,659 | 9/1994 | Do et al. | 395/700 |
| 5,355,317 | 10/1994 | Talbott et al. | 384/468 |
| 5,357,440 | 10/1994 | Talbott et al. | 364/467 |
| 5,359,523 | 10/1994 | Talbott et al. | 364/468 |
| 5,359,537 | 10/1994 | Saucier et al. | 364/489 |
| 5,361,357 | 11/1994 | Kionka | 395/700 |
| 5,398,195 | 3/1995 | Kim | 364/491 |
| 5,406,497 | 4/1995 | Altheimer et al. | 364/488 |
| 5,416,721 | 5/1995 | Nishiyama et al. | 364/491 |
| 5,418,733 | 5/1995 | Kamijima | 364/490 |
| 5,418,954 | 5/1995 | Petrus | 395/700 |
| 5,440,720 | 8/1995 | Baisuck et al. | 395/500 |
| 5,452,239 | 9/1995 | Dai et al. | 364/578 |
| 5,483,461 | 1/1996 | Lee et al. | 364/490 |
| 5,485,396 | 1/1996 | Brasen et al. | 364/491 |
| 5,490,266 | 2/1996 | Sturges | 395/500 |
| 5,490,268 | 2/1996 | Matsunaga | 395/550 |
| 5,491,640 | 2/1996 | Sharma et al. | 364/488 |
| 5,493,508 | 2/1996 | Dangelo et al. | 364/489 |
| 5,579,510 | 11/1996 | Wang et al. | 395/500 |
| 5,644,499 | 7/1997 | Ishii | 364/489 |
| 5,649,176 | 7/1997 | Selvidge et al. | 395/551 |
| 5,740,347 | 4/1998 | Avidan | 395/183.09 |

OTHER PUBLICATIONS

Tufte, "CML III Bipolar Standard Cell Library", Proceedings of the 1988 Bipolar Circuits and Technology Meeting, Minneapolis, Minnesota, Sep., 1988, pp. 180–182.

*Primary Examiner*—Kevin J. Teska
*Assistant Examiner*—Leigh Marie Garbowski
*Attorney, Agent, or Firm*—Nawrocki, Rooney & Sivertson, P.A.

[57] ABSTRACT

A method and apparatus for identifying gated clocks within a circuit design. In a typical design, each of the number of gated clock signals is uniquely determined by a particular logical combination of a number of raw clock signals and a number of enable signals. In the present invention, the gated clock signals may be identified by: identifying which of the number of raw clock signals is coupled, through combinational logic, to a selected one of the number of state devices, thereby resulting in an identified raw clock signal; identifying which of the number of enable signals is coupled, through combinational logic, to the selected one of the number of state devices, thereby resulting in an identified enable signal; and determining which of the number of gated clock signals is uniquely determined by the particular combination of the identified raw clock signal and the identified enable signal.

48 Claims, 21 Drawing Sheets

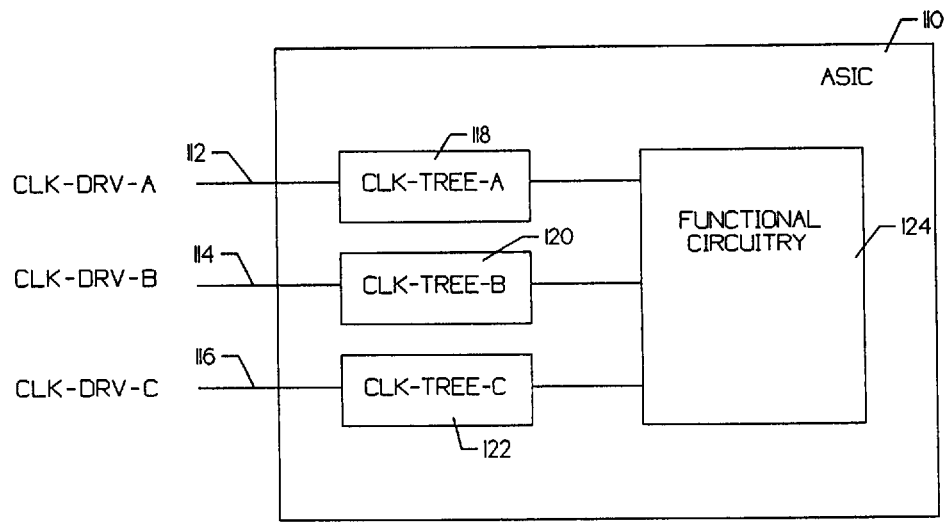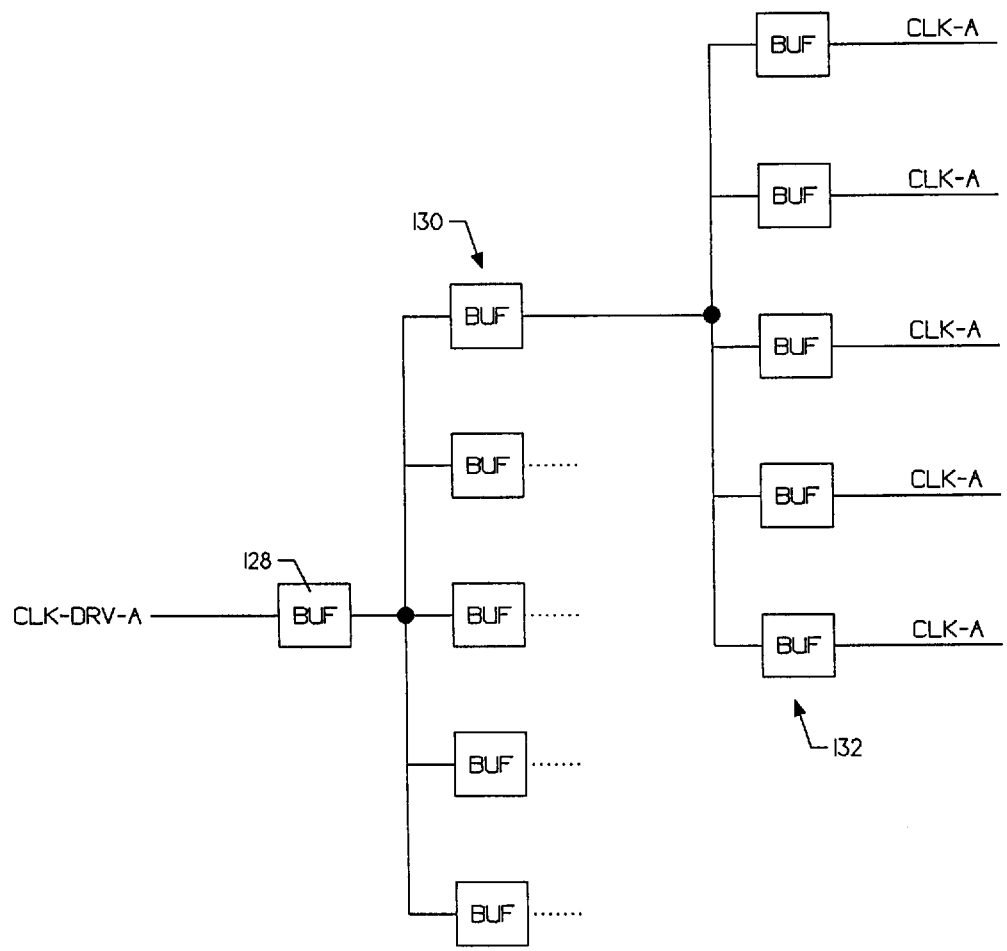
FIG. 4

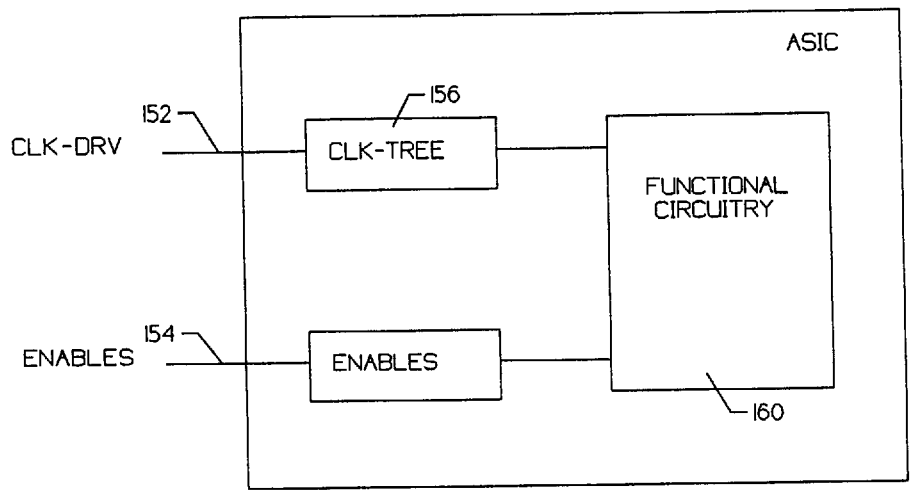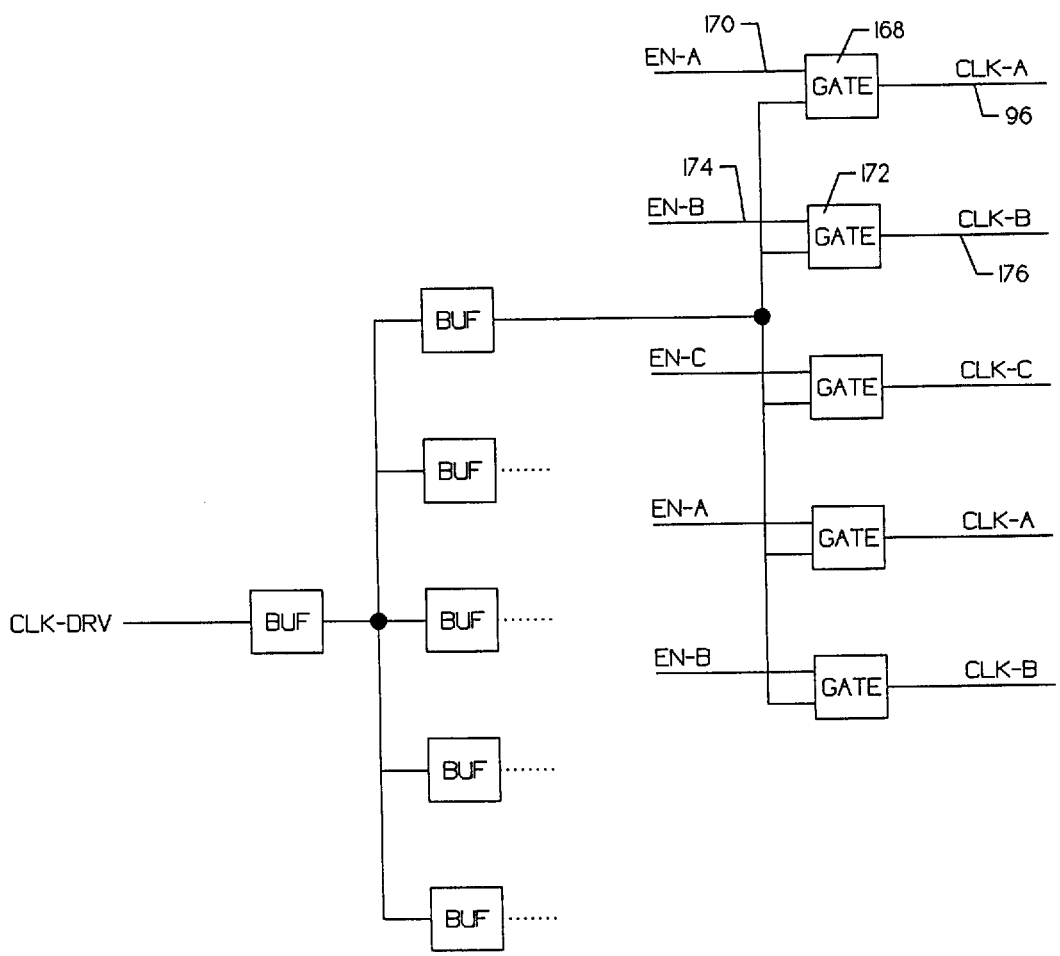
FIG. 5

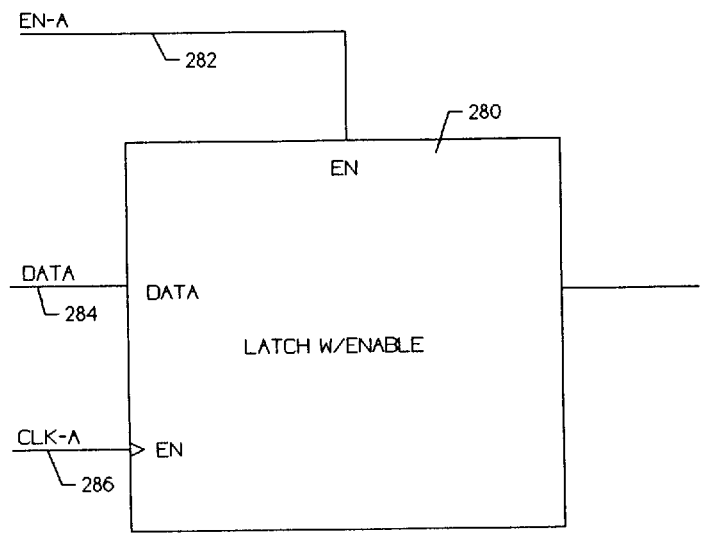
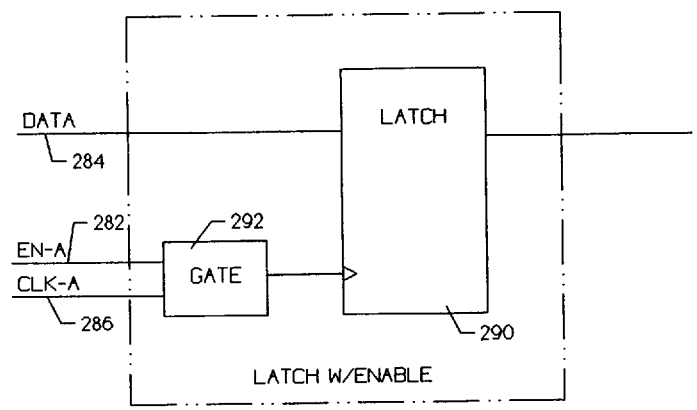
FIG. 6

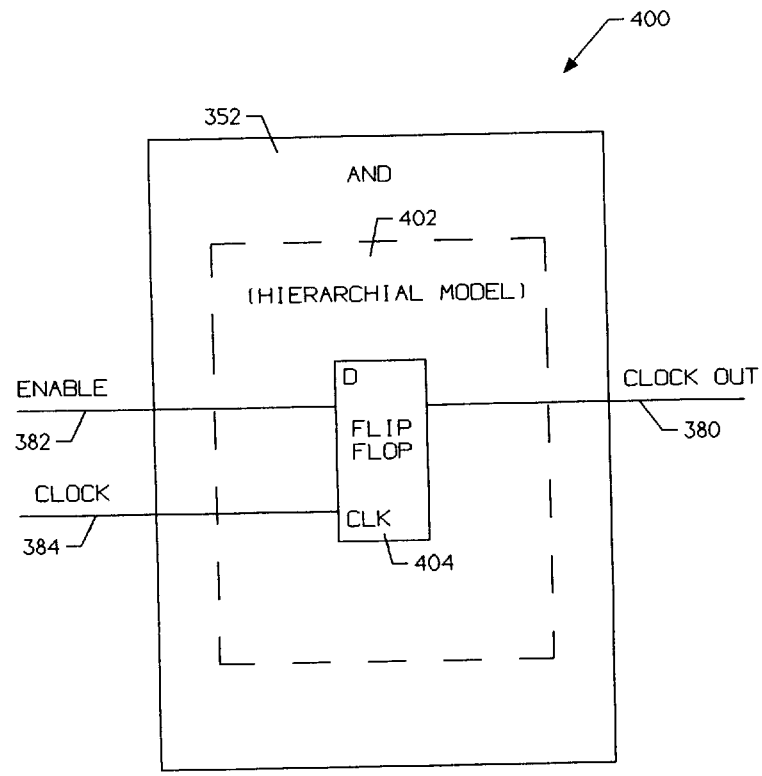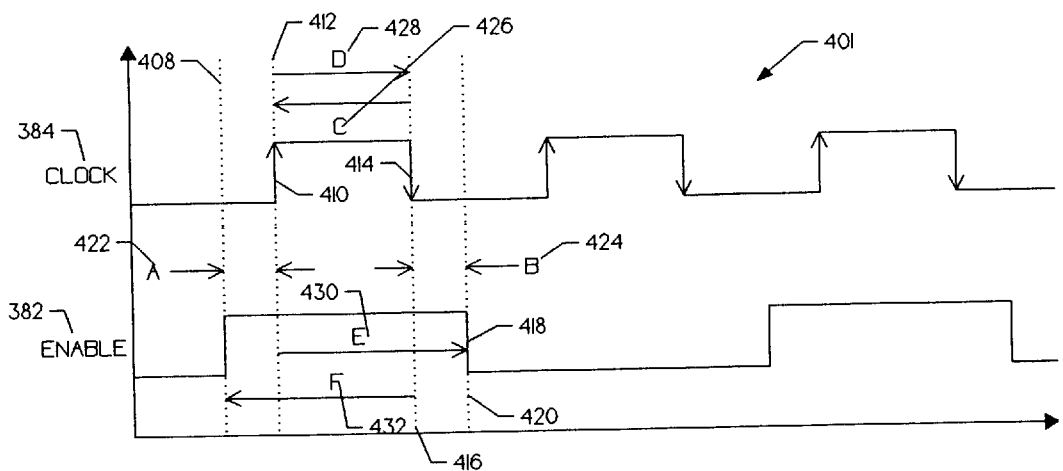
FIG. 9

FIG. 14A

| TRACE # | INITIAL PIN | DESTINATION STATE DEVICE |
|---|---|---|
| 1 | PHASE 1 | STATE DEVICE A |
| 2 | PHASE 2 | STATE DEVICE B |
| 3 | PHASE 1-W | STATE DEVICE C |
| 4 | PHASE 2-W | STATE DEVICE D |
| 5 | 1A ENABLE | STATE DEVICE A |
|   |   | STATE DEVICE C |
| 6 | 2A ENABLE | STATE DEVICE B |
| 7 | 1B ENABLE | NONE |
| 8 | 2B ENABLE | NONE |

FIG. 14B

|  | PHASE 1 | PHASE 2 | PHASE 1-W | PHASE 2-W |
|---|---|---|---|---|
| 1A ENABLE | PHASE 1A | /////// | PHASE 1A-W | /////// |
| 2A ENABLE | /////// | PHASE 2A | /////// | PHASE 2A-W |
| 1B ENABLE | PHASE 1B | /////// | PHASE 1B-W | /////// |
| 2B ENABLE | /////// | PHASE 2B | /////// | PHASE 2B-W |

FIG. 14C

| STATE DEVICE | ASSIGNED CLOCK SIGNAL |
|---|---|
| STATE DEVICE - A | PHASE 1A |
| STATE DEVICE - B | PHASE 2A |
| STATE DEVICE - C | PHASE 1A-W |
| STATE DEVICE - D | PHASE 2-W |

| TRACE # | INITIAL STATE DEVICE | DESTINATION PIN |
|---|---|---|
| 1 | STATE DEVICE A | PHASE 1 |
|   |                | 1A ENABLE |
| 2 | STATE DEVICE B | PHASE 2 |
|   |                | 2A ENABLE |
| 3 | STATE DEVICE C | PHASE 1-W |
|   |                | 1A ENABLE |
| 4 | STATE DEVICE D | PHASE W-2 |

FIG. 16A

|           | PHASE 1   | PHASE 2   | PHASE 1-W  | PHASE 2-W  |
|-----------|-----------|-----------|------------|------------|
| 1A ENABLE | PHASE 1A  |           | PHASE 1A-W |            |
| 2A ENABLE |           | PHASE 2A  |            | PHASE 2A-W |
| 1B ENABLE | PHASE 1B  |           | PHASE 1B-W |            |
| 2B ENABLE |           | PHASE 2B  |            | PHASE 2B-W |

FIG. 16B

| STATE DEVICE | ASSIGNED CLOCK SIGNAL |
|---|---|
| STATE DEVICE - A | PHASE 1A |
| STATE DEVICE - B | PHASE 2A |
| STATE DEVICE - C | PHASE 1A-W |
| STATE DEVICE - D | PHASE 2-W |

FIG. 16C

METHOD AND APPARATUS FOR IDENTIFYING GATED CLOCKS WITHIN A CIRCUIT DESIGN USING A STANDARD OPTIMIZATION TOOL

CROSS REFERENCE TO CO-PENDING APPLICATIONS

The present application is related to U.S. patent application Ser. No. 08/524,017, filed Aug. 29, 1995, entitled "A Method of Stabilizing Component and Net Names of Integrated Circuits In Electronic Design Automation Systems", U.S. patent application Ser. No. 08/752,620 filed Nov. 19, 1996, entitled "Method and Apparatus for Optimizing a Gated Clock Structure Using a Standard Optimization Tool", U.S. patent application Ser. No. 08/752,617, filed Nov. 19, 1996, entitled "Method and Apparatus for Incrementally Optimizing a Circuit Design", U.S. patent application Ser. No. 08/752,619, filed Nov. 19, 1996, entitled "Method and Apparatus For Providing Optimization Parameters to a Logic Optimizer Tool", U.S. patent application Ser. No. 08/752,618, filed Nov. 19, 1996, entitled "Method and Apparatus for Optimizing a Circuit Design Having Multi-Cycle Clocks Therein". U.S. patent application Ser. No. 08/752,621, filed Nov. 19, 1996, entitled "Method and Apparatus for Monitoring the Performance of a Circuit Optimization Tool", all assigned to the assignee of the present invention, and all incorporated herein by reference.

BACKGROUND OF THE INVENTION

1. Field of the Invention

This invention relates generally to electronic design automation (EDA) systems used for designing integrated circuits. The invention is more specifically related to a method and apparatus for identifying gated clocks within a circuit design using a standard EDA optimization tool during the integrated circuit design process.

2. Description of the Prior Art

The design process for all integrated circuits is composed of several discrete operations. Initially, the proposed functionality for a circuit is analyzed by one or more chip designers. These designers define the logical components of the circuit and their interactions by specifying the logic design using design capture tools. These design capture tools are commonly implemented in software executing on an engineering workstation, with well-known input devices being used to receive design information from the chip designer, and output devices, such as computer displays, being used to provide visual feedback of the design to the designer as it is being constructed. Such software is typically implemented as part of an electronic design automation (EDA) system. Specifically, the design entry operation involves generating a description of the logic design to be implemented on the circuit chip in an appropriate machine-readable form. Chip designers generally employ hierarchial design techniques to determine the appropriate selection and interconnection of logic and/or memory devices which will enable the chip to perform the desired function. These techniques involve describing the chip's functionality at various levels of abstraction, ranging from the most general function performed by the chip to the precise functions performed by each logic and/or memory element on the chip.

A common method for specifying the integrated circuit design is the use of hardware description languages. This method allows a circuit designer to specify the circuit at the register transfer level (also known as a "behavior description"). Using this method, the circuit is defined in small building blocks. The names of the building blocks are specified by the circuit designer. Thus, they usually are logical names with specific functional meaning.

Encoding the design in a hardware description language (HDL) is a major design entry technique used to specify modern integrated circuits. Hardware description languages are specifically developed to aid a designer in describing a circuit. These languages often contain specific functions and syntax to allow complex hardware structures to be described in a compact and efficient way.

It is useful to distinguish between those components of an integrated circuit design called cells, provided by a silicon chip vendor as primitive cells (i.e., leaf candidates), and the user-defined hierarchy blocks built upon them. One way is to speak of a "cell library" vs. a "design library" as two separate libraries, both of which are available to subsequent designs. Alternatively, at least initially, a design library contains a cell library. A cell library is a database containing detailed specifications on the characteristics of each logical component available for use in a design. Initial cell library contents are usually provided by the chip vendor. The components in the cell library are identified by the generic description of the component type. For example, the term "NAND" for a NAND gate is its type description and distinguishes this component from others such as OR gates, flip-flops, multiplexors, and so on. A two-input NAND gate might be of type 2NAND. When a 2NAND component is specified as part of a given circuit design, it is given an instance name, to distinguish it from all other 2NAND gates used in the circuit. The instance name typically includes the instance names of all parent instances by concatenation when defining the instance in the context of the chip.

A single name is sufficient when dealing only in the context of a single user function. The user-defined blocks can then be used to design larger blocks of greater complexity. The user-defined blocks are added to the design library, which grows from the additions of new design modules as the design evolves. The top level of the design hierarchy may be a single block that defines the entire design, and the bottom layer of the hierarchy may consist of leaf cells, the cells (i.e., the logical components) that were originally provided in the cell library. The resulting design is often called a detailed (or gate-level) description of the logic design.

The generation of the detailed description is often accomplished by logic design synthesis software for HDL entry. The logic design synthesis software generates a gate-level description of user-defined input and output logic, and also creates new gate-level logic to implement user-defined logical functions. Typically, the logic design synthesis software is executed many times during the integrated circuit design process, because errors may be detected during the simulation and testing phases of the design cycle and then fixed in the behavioral description.

The output of the design capture and synthesis tools is typically a logic design database which completely specifies the logical and functional relationships among the components of the design. Once the design has been converted into this form, it may be optimized by sending the logic design database to a logic optimizer tool typically implemented in software.

In many logic optimizer tools, the optimization process may include a characterization step and an optimization step. During the characterization step, various optimization parameters are assigned to selected portions of the design.

For example, for those portions of the design that are to be optimized for timing, the characterization step may perform a timing analysis of the design, and identify critical paths within the design that need to be improved by optimization. The characterization step may then assign timing constraints to those portions of the design, indicating the degree that they must be optimized to meet the desired timing goals.

After the characterization step is complete, the optimizer tool may perform an optimization step. The optimization step typically attempts to optimize the design such that all of the timing constraints assigned by the characterization step are satisfied. During the optimization step, the logic optimizer may, for example, remove logic from the design that is unnecessary, minimize the logic that is necessary to implement certain functions, increase the power of selected cells to improve performance, etc.

After the design has been optimized, the circuit designers typically verify that the resulting logic definition is correct and that the integrated circuit implements the expected function. This verification is currently achieved by timing and simulation software tools. The design undergoes design verification analysis in order to detect flaws in the design. The design is also analyzed by simulating the design to assess the functionality of the design. If errors are found or the resulting functionality is unacceptable, the designer modifies the behavior description as needed. These design iterations help to ensure that the design satisfies the desired requirements.

After timing verifications and functional simulation have been completed, placement and routing of the design's components is performed. These steps involve allocating components of the design to locations on the integrated circuit chip and interconnecting the components to form nets. Finally, final timing verification is performed after placement and routing is complete.

A problem in the above design process may occur when gated clocking schemes are used in the design. That is, typical logic optimizer tools can only handle standard clocking schemes, such as where a number of clock signals are independently generated and distributed throughout the system, and each state device in the design is coupled to only one of the clock signals. For high performance designs, however, it is often desirable to use gated clocking schemes to increase the density and performance of the design, and to ease the difficulty of placing and routing the various clock trees. It has been found that a gated clocking scheme can increase the performance of a design by as much as 10–20 percent over standard clock schemes. Further, the use of a gated clocking scheme can reduce the number of raw clock signals that must be routed throughout the design, and thus the number of critical clock nets within the design.

In a gated clock scheme, both a clock enable signal and a raw clock signal may be provided to a logic gate, wherein the output of the logic gate may provide a "gated clock" signal to the corresponding state devices. Typically, the clock enable signals may have a substantially wider pulse width than the raw clock signals, and may easily envelope the corresponding clock pulses. Thus, the logic used to distribute the clock enable signals is generally not subject to the same timing constraints as the clock trees used to distribute the raw clock signals. For this reasons, the logic used to distribute the clock enable signals can typically be automatically placed and routed, without any special consideration given thereto.

In contrast, the clock trees that distribute the raw clock signals must typically either be manually placed and routed within the design, or priority routing channels must be assigned to those nets during the auto place and route process. In either case, the designer typically must compare the corresponding net lengths for each of the raw clock trees to ensure that the clock skew between the resulting raw clock signals is minimized. As can readily be seen, a gated clocking scheme may reduce the number of critical raw clock signals by providing a number of less sensitive clock enable signals, and thus may reduce the overall complexity of placing and routing the clocking network.

Logic Optimizer tools typically use clock information during the logic optimization process to optimize the overall design. Such clock information typically identifies a particular clock signal for each of the state devices within the design. For example, the clock information may identify each state device within the design that is controlled by each clock signal. The logic optimizer tool may then calculate the maximum allowed propagation time between any two registers in the design by identifying the corresponding clock signals that are associated therewith.

The clocking information may be provided to the logic optimizer tool in any number of ways. For example, the user may provide a list of the ASIC pins that are used as clock inputs, and/or the instance names of drivers contained within the design that generate the clock signals. To identify the particular clock signal that corresponds to each state device, the logic optimizer tool may include a tracing capability, wherein the tracing capability may trace each clock signal from the pre-identified clock source to the corresponding state devices, thereby identifying a correspondence between the various clock signals and the number of state devices.

A limitation of the above clock identifying method is that the tracing scheme provided by the logic optimizer tool may not properly identify the correct clock in designs that use gated clocking schemes. That is, when the raw clock signals are traced to the corresponding state devices, the clock enable signals may not be identified or taken into account. Accordingly, the above-referenced clock tracing scheme may incorrectly associate a raw clock signal with each state device, rather than the correct gated clock signal. It is recognized that it may be possible to provide the logic optimizer tools with the proper clock information by manually assembling a clock list with the appropriate clocking information, including the gated clocking information. However, for large designs, this is a prohibitively large task, and extremely tedious.

SUMMARY OF THE INVENTION

The present invention overcomes many of the disadvantages of the prior art by providing a method and apparatus for identifying gated clocks within a circuit design. This may be accomplished by, for example, either providing a separate apparatus or tool to identify the gated clocks within the circuit design and provide the resulting clock information to a standard optimization tool, or by using the tracing capability of a standard optimization tool to identify the gated clocks within the circuit design.

In an exemplary embodiment, a method and apparatus is provided for determining which of a number of gated clock signals control each of the number of state devices. In a typical design, each of the number of gated clock signals is uniquely determined by a particular logical combination of a number of raw clock signals and a number of enable signals. In a preferred embodiment, the gated clock signals may be identified by: identifying which of the number of raw clock signals is coupled, through combinational logic, to a selected one of the number of state devices, thereby resulting in an identified raw clock signal; identifying which of the number of enable signals is coupled, through combinational logic, to the selected one of the number of state devices, thereby resulting in an identified enable signal; and determining which of the number of gated clock signals is uniquely determined by the particular combination of the identified raw clock signal and the identified enable signal.

It is recognized that the above-referenced identifying means may use the net tracing capability of a standard optimizer tool. That is, the first identifying means may include tracing the number of raw clock signals through the circuit design to corresponding ones of the number of state devices. Similarly, the second identifying means may include tracing the number of enable signals through the circuit design to corresponding ones of the number of state devices. This may continued for each state device in the circuit design. After the corresponding raw clock signals and enable signals are identified for each state device within the circuit design, an appropriate gated clock signal can be determined and assigned to each state device, and this information may be provided to the optimizer program.

It is contemplated that the number of raw clock signals and enable signals may be traced from pre-identified source nets to the corresponding state devices, as described above, or by tracing the raw clock signals and enable signals from the state devices back to pre-identified source nets. In either case, the relationship between each state device and the corresponding raw clock signals and enable signals may be determined.

Each of the above-referenced identifying means may record the correspondence between the raw clock signals, the enable signals, and the number of state devices to one or more correspondence files. As such, the determining means may read the one or more correspondence files and determine, via a look-up table or the like, which of the number of gated clock signals correspond to each of the state devices. The result may be provided to an optimizer tool for circuit optimization.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 4 is a schematic diagram showing a number of exemplary clock trees, wherein each clock tree is used to generate a different one of a number of clocks;

FIG. 5 is a schematic diagram showing an exemplary clock tree that uses clock enable signals to generate different ones of a number of clocks;

FIG. 6 is a schematic diagram showing a latch with enable, and a typical implementation therefor;

FIG. 9 is a block diagram illustrating an exemplary model for the AND gate of FIGS. 6–8;

FIG. 14A is a table showing the results of an exemplary forward tracing methodology in accordance with the present invention, including a number of pre-defined initial pins and the corresponding destination state devices for the design shown in FIG. 13;

FIG. 14B is a table showing the logical correspondence between a number of exemplary raw clock signals and a number of exemplary enable signals;

FIG. 14C is a table showing the resulting gated clocks assigned to each state device shown in FIG. 13, using the tables shown in FIG. 14A and FIG. 14B;

FIG. 16A is a table showing the results of an exemplary backward tracing methodology in accordance with the present invention, including a number of initial state devices and the corresponding destination pins for the design shown in FIG. 15;

FIG. 16B is a table showing the logical correspondence between a number of exemplary raw clock signals and a number of exemplary enable signals;

FIG. 16C is a table showing the resulting gated clocks assigned to each state device shown in FIG. 15, using the table shown in FIG. 16A and FIG. 16B;

DETAILED DESCRIPTION OF THE PREFERRED EMBODIMENTS

Figure 1:
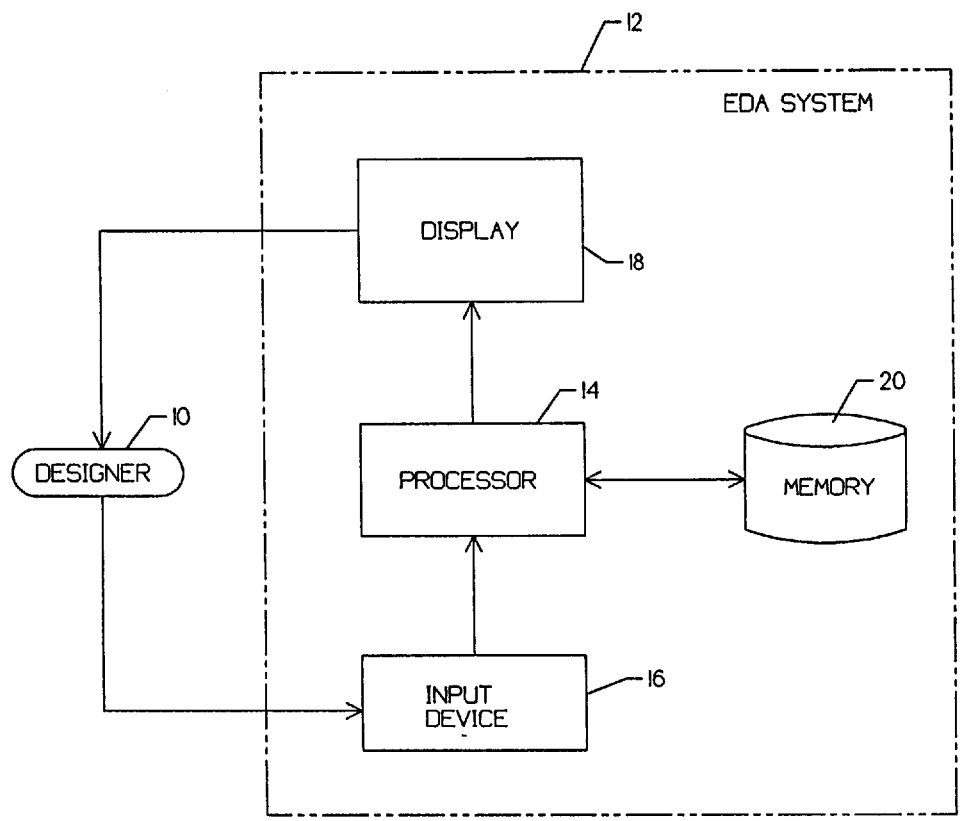
FIG. 1 is a block diagram of the computer-based environment of the present invention.

The detailed descriptions which follow are presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result.

These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method operations in operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression of the present invention is input to the computer to control operations therein. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons.

FIG. 1 is a block diagram of the computer-based environment of the present invention. A Designer 10 interacts with an Electronic Design Automation (EDA) System 12 to enter an integrated circuit design, validate the design, place the design's components on a chip, and route the interconnections among the components. The integrated circuit may be an application specific integrated circuit (ASIC). The EDA System 12 includes a Processor 14, which executes operating system software as well as application programs known as EDA software. The Processor is found in all general purpose computers and almost all special purpose computers. The EDA System 12 is intended to be representative of a category of data processors suitable for supporting EDA operations. In the preferred embodiment, the EDA System is a HP A1097C Series 700 engineering workstation, commercially available from Hewlett-Packard Corporation, although other engineering workstations or computer systems from manufacturers such as Sun Microsystems, Inc. may also be used.

The Designer 10 enters design information into the EDA System by using a well-known Input Device 16 such as a mouse, keyboard, or a combination of the two devices. It should be understood, however, that the Input Device may actually consist of a card reader, magnetic or paper tape reader, or other well-known input device (including another computer system). A mouse or other cursor control device is typically used as an Input Device as a convenient means to input information to the EDA System to select command modes, edit input data, and the like. Visual feedback of the design process is given to the Designer by showing the design being constructed as graphical symbols on Display 18. The Display is used to display messages and symbols to the Designer. Such a Display 18 may take the form of any of several well-known varieties of CRT displays. The EDA software being executed by the Processor 14 stores information relating to logic design in Memory 20. The Memory may take the form of a semiconductor memory, magnetic disks, optical disks, magnetic tape or other mass storage device.

Figure 2:
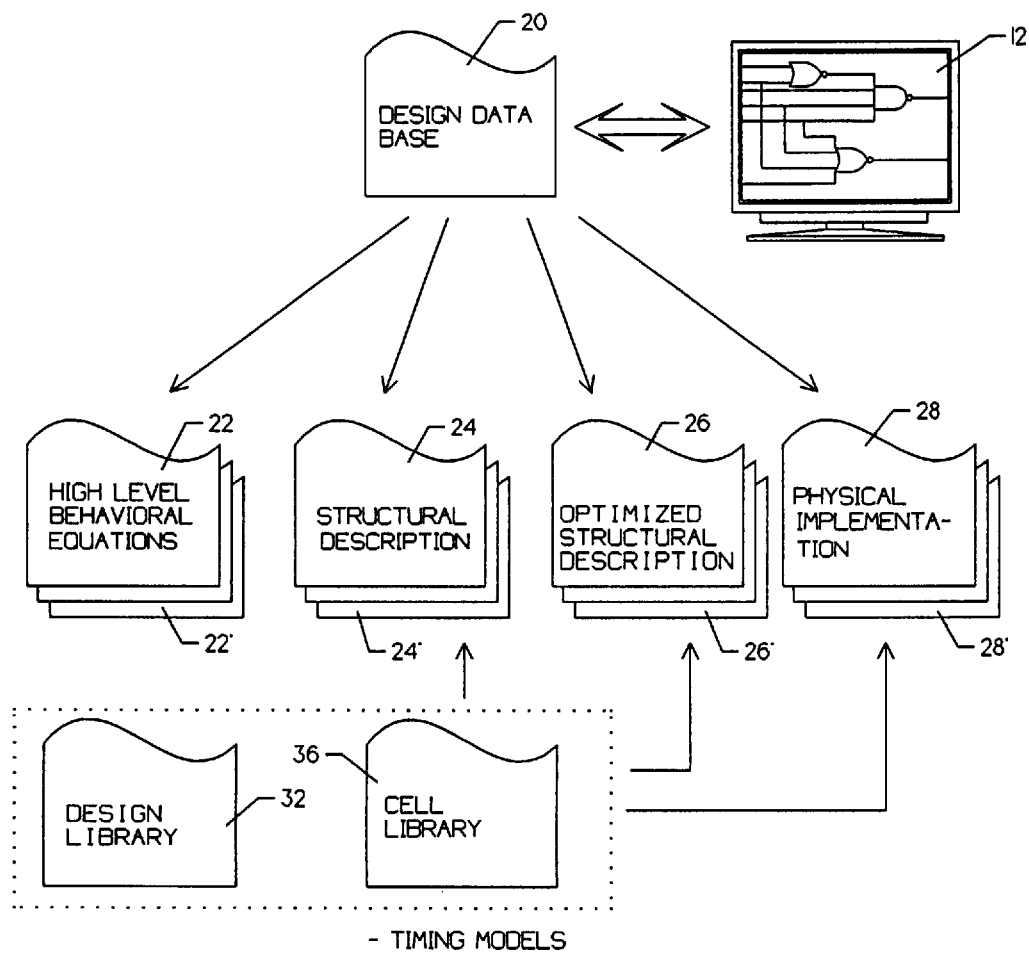
FIG. 2 is a block diagram showing typical circuit representations stored within a circuit design database.

FIG. 2 is a block diagram showing a number of circuit representations stored within a typical circuit design database. The design database 20 may include a high level behavioral representation 22, a structural description representation 24, an optimized structural representation 26, and a physical representation 28. Further, the database may include previous revisions of the high level behavioral representation 22', a structural description representation 24', an optimized structural representation 26', and a physical representation 28'.

As indicated above, the circuit designer typically specifies the logic design of an integrated circuit by using design capture software that runs on an EDA system 12. In the preferred embodiment, the Hardware Computer-Aided Design System (HCADS), available from Unisys Corporation, is used as Design Capture software, although other design capture programs from companies such as Cadence Design Systems, Inc., Synopsys, Inc., and Mentor Graphics, Inc., are also commercially available. At a minimum, when using a hardware description language, any text editor program may be used to specify the design. The result of this activity is a high level behavior description representation 22, which typically represents the logic design as specified at the register transfer level. Items in the high level behavior description representation 22 may map to functional components of the design. In the preferred embodiment, the high level behavior description representation 22 is written in a design language called Universal Design Source Language (UDSL), although other existing, well-known hardware design languages could also be used.

The high level behavior description representation 22 may be input to a logic design synthesis tool. The logic design synthesis tool may assign the gates and other circuitry needed to implement the functions specified by the high level behavior description representation 22. In the preferred embodiment, the synthesis software is the Behavior to Structure Translator (BEST) synthesis tool developed by Unisys Corporation. However, alternate embodiments such as the VHDL Design Compiler commercially available from Synopsys, Inc., the DesignBook Synthesis tool from Escalade, and the Synergy synthesis tool available from Cadence Design Systems, Inc. may also be used.

The Logic Design Synthesis tool may output a structural description representation 24, which is sometimes referred to as the netlist for the design. This file contains the gate-level definition of the logic design. The structural description representation 24 may be in the Prime Behavior Description Language ('BDL), a format developed and used by the Unisys Corporation.

The structural description representation 24 may be provided to other EDA software programs, including an optimization program. The circuit optimization program may read the structural description representation 24 and optimize the logic represented therein. Typically, the optimization tool may read and write Electronic Data Interchange Format (EDIF) files. The EDIF format is an industry standard format for hardware design language information. Thus, embedded within a typical optimization program is an EDIF reader and an EDIF writer. The EDIF writer and reader translate the circuit design database 20 from an internal format to and from the EDIF format.

The optimization methodology used by the optimization program may be selectable by the user. For example, the user may direct the optimization tool to optimize a particular portion of the circuit design such that power, area, speed or other predefined parameters are optimized.

The optimization program may optimize the structural description representation 24 using components from a selected cell library 30 or design library 32. The optimization program may provide an optimized structural description representation, as shown at 26. In the preferred embodiment, the optimization program is the Design Compiler, commercially available from Synopsys, Inc.

The optimized structural description representation 26 may then be placed and routed using a commercially available place and route tool. In the preferred embodiment, the place and route tool is provided by Cadence Design Systems, Inc. is utilized, although other firms active in the electronic design automation (EDA) industry all sell systems similar in function to the above-mentioned Cadence tool.

The result may be stored in the circuit design database 20 as a physical implementation representation 28. Typical cell libraries include a number of representation of each component therein including a symbol representation, a schematic representation and a physical representation. This may also be true for selected components in the design library 32. The physical implementation representation 28 of the circuit design database 20 typically includes references to the physical representation of the library components referenced therein.

Figure 3:
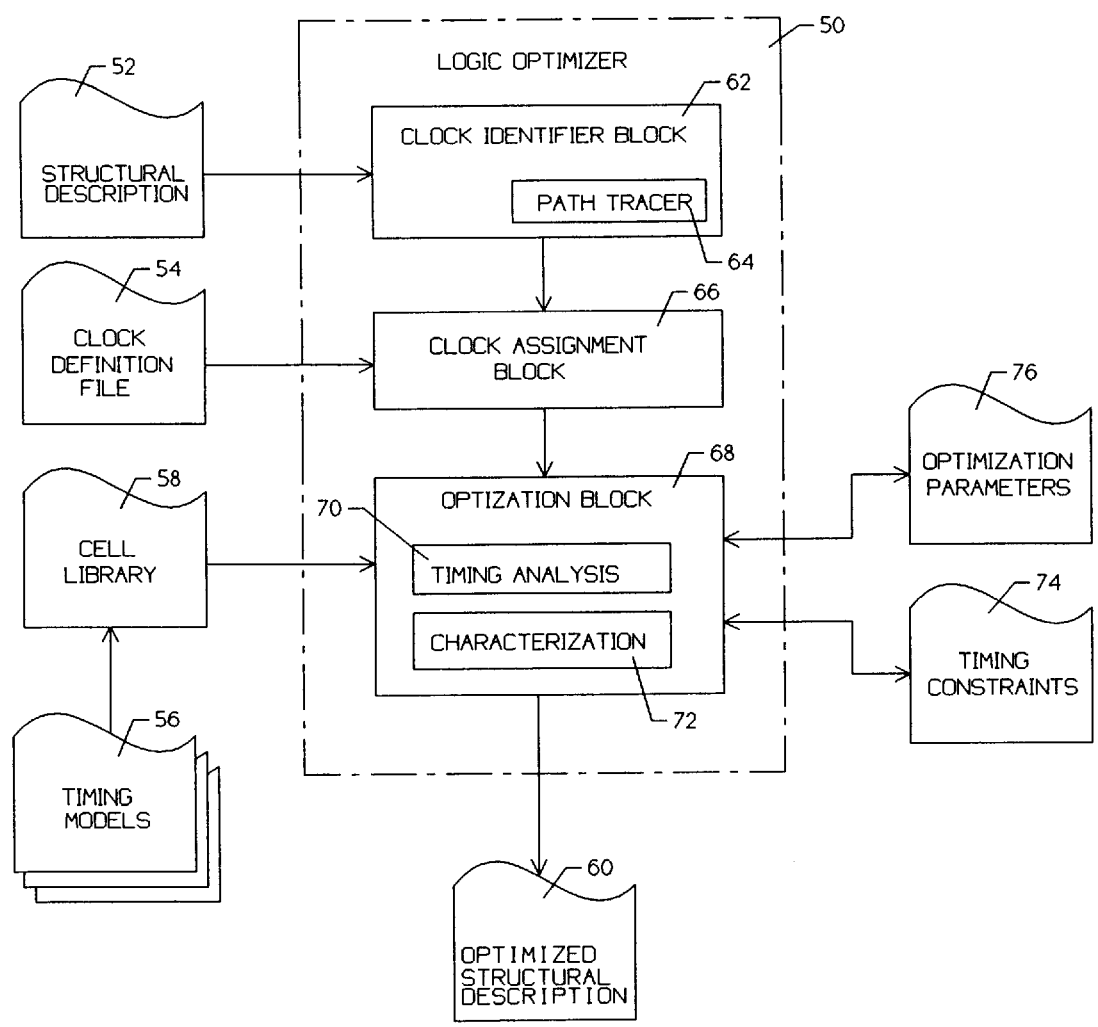
FIG. 3 is a block diagram that illustrates the operation of a standard optimization program.

FIG. 3 is a block diagram that illustrates the operation of a standard optimization program 50. The standard optimization program 50 may read a structural description 52 of a desired circuit design. The standard optimization program 50 may further read a clock definition file 54, and timing models 56 from cell library 58, as shown. The standard optimization program 50 may then optimize the design and provide an optimized structural description 60.

More specifically, the standard optimization program 50 may include a clock identifier block 62 for identifying which of a number of clocks are associated with each state device within the circuit design. The clock identifier block 62 may include a path tracer capability 64, for tracing from pre-identified clock nets/ports to corresponding state devices within the circuit design. The clock identifier block may then record which clock is associated with each state device.

The standard optimization program 50 may further include a clock assignment block 66 for assigning a particular clock waveform to each state device in the circuit design. Clock assignment block 66 may receive the clock/state device correspondence information from the clock identifier block 62, as shown. Further, the clock assignment block 66 may receive predetermined clock definition information from a clock definition file 54. The clock definition file 54 may define the waveform for each of the number of clock signals, including the clock period and duty cycle thereof. The clock assignment block 66 may thus assign a particular clock waveform to each of the state devices within the circuit design, depending on the clock that is associated therewith, and the waveform defined for that particular clock signal. This clocking information is required for the proper analysis of circuit designs that use a single, or multi-phase clock schemes, as described in more detail below.

The circuit design and the clocking information may then be provided to optimization block 68. Optimization block 68 may include a timing analysis block 70 and a characterization block 72. The timing analysis block 70 may read the structural description 52, as described above. Typically, the structural description 52 describes the design using components from cell library 58. Thus, the timing analysis block 70 may read the necessary timing models 56 for each of the components from cell library 58. The timing analysis block 70 may then perform a timing analysis of the design and identifies the critical paths therein.

The characterization block 72 may read the results of the timing analysis block 70 and assigns various optimization parameters 76 to selected portions of the design. For example, for those portions of the design that are to be optimized for timing, the characterization block 72 may assign timing constraints 74 to those portions of the design that lie in the critical paths. In addition, the user may supply various optimization parameters 76 to help control the optimization of the design. For example, the user may identify various blocks that are to be optimized for performance, power, etc., or not optimized at all. The timing constraints 74 assigned by the characterization block 72 typically indicate the degree that each of the associated portions of the design must be optimized to meet the desired timing goals of the overall design.

Optimization block 68 may read the timing constraints 74, and attempt to optimize the design such that all of the timing constraints assigned by the characterization block 72 are satisfied. During optimization, the logic optimization program 50 may, for example, eliminate redundant logic, minimize logic implementation, increase the power of selected cells to improve performance, etc. After optimization, the optimization block 68 may provide an optimized structural description 60, as shown.

FIG. 4 is a schematic diagram showing a number of exemplary clock trees, wherein each clock tree is used to generate a different one of a number of clocks. In the illustrative diagram, an application specific integrated circuit (ASIC) is shown at 110. The ASIC 110 may have a number of different clock signals provided thereto. For example, ASIC 110 may have three clock signals driven thereon, namely, CLK-DRV-A 112, CLK-DRV-B 114, and CLK-DRV-C 116. Each of the clock signals may have a different clock period and may drive different portions of the functional circuitry 124.

Each of the clock signals, for example CLK-DRV-A 112, is driven onto the ASIC 110 and provided to a clock tree, for example CLK-TREE-A 118. Each of the clock signals 112, 114 and 116 have a corresponding clock tree 118, 120 and 122, respectively. The clock trees are required to provide the necessary fan out to the corresponding clock signal to drive the functional circuitry 124.

An exemplary implementation of CLK-TREE-A 118 is shown in the lower portion of FIG. 4. The CLK-DRV-A signal 112 is provided to a buffer as shown at 128. The output of buffer 128 is provided to the inputs of a number of other buffers as shown at 130. In the illustrative diagram, the CLK-DRV-A signal 112 is fanned out to five separate buffer elements. Typically, there are design rules which define the maximum fan out allowed for each buffer element.

Each of the buffers shown at 130 may then be fanned out to five more buffer elements as shown at 132. This may be continued until there is a sufficient number of buffers to drive the required registers or latches in the functional circuitry 124. In the illustrative embodiment, only three levels of the clock tree are shown. However, it is recognized that in complex designs, the clock trees may exceed three levels, and may have six or more levels.

As can readily be seen, each of the clocks is independently generated and distributed throughout the design. A limitation of this implementation is that it may be difficult to control the clock skew between each of the clock signals, particularly when the clock trees are automatically placed and routed. Further, because a complete clock tree must be maintained for each clock signal, for example CLK-DRV-A 112, it is evident that the clock trees may represent a relatively large overhead in both chip real estate and chip power.

FIG. 5 is a schematic diagram showing an exemplary clock tree that uses clock enable signals to generate different ones of a number of clocks. As indicated above, a difficulty with the structure shown in FIG. 4 is that a separate clock tree must be provided for each clock signal. The clock trees may consume a relatively large area and may be difficult to route and correctly time. Clock skew, for example, may be difficult to manage, particularly when the clock trees are automatically placed and routed. This is true both at the ASIC level, and at the board and system level. Thus, a circuit designer may be forced to place and route the logic within the clock trees by hand, or may be forced to give the clock tree logic a high priority if place and routed by an automatic place and route tool.

An alternative clocking scheme is shown in FIG. 5. In this clocking scheme, the three clock signals 112, 114 and 116 of FIG. 4 are replaced by a single clock signal 152, and a number of enable signals 154. The clock signal 152 is provided to a clock tree 156, as shown. However, the clock signal is eventually provided to a number of gates. Each of the gates is enabled by an enable signal. For example, gate 168 is enabled by an EN-A signal 170. Similarly, gate 172 is enabled by an EN-B signal 174. The enable signals control which of the clock pulses are provided by the corresponding gate cell. For example, gate 168 provides a CLK-A signal 96, and gate 172 provides a CLK-B signal 176. Thus, in this implementation, the gates generate the various clock signals required by the functional circuitry 160, and thus only a single clock tree 156 is required to generate the number of different clock signals.

The enable signals 154 generally run at a lower frequency than the raw clock signals 152. Thus, the timing of the enable signals 154 may not be as critical, and therefore, may not require the same degree of attention by a circuit designer. Further, since only a single clock tree is required to generate the number of clock signals, the overhead required by this implementation may be less than that shown in FIG. 4.

FIG. 6 is a schematic diagram showing a latch with enable, and a typical implementation therefor. The latch with enable 280 has an enable input 282, a data input 284, and a clock input 286. The latch with enable block 280 is typically implemented using a standard latch element 290 and a gate 292. Referring to the lower portion of FIG. 6, the gate 292 may receive the enable signal 282 and the clock signal 286, as shown. In this configuration, both the enable signal 282 and the clock signal 286 must be asserted before a "GATED" clock 294 is asserted, and provided to latch 290.

Many component libraries may include a latch with enable component. Thus, although implemented in a manner similar to that shown in the lower portion of FIG. 6, functional and timing models for the latch with enable component are generally provided at the component level as shown at 280. Thus, any timing difficulties associated with gate 292 may be avoided. That is, the optimization tool clan correctly define the gated clock. However, if the gating takes place outside the latch primitive, then the tool does not correctly interpret the gated clock. Thus, a limitation of this approach is that each latch 290 must include a gate 292. This may require a substantial overhead in both real estate and power, as further described herein.

Figure 7:
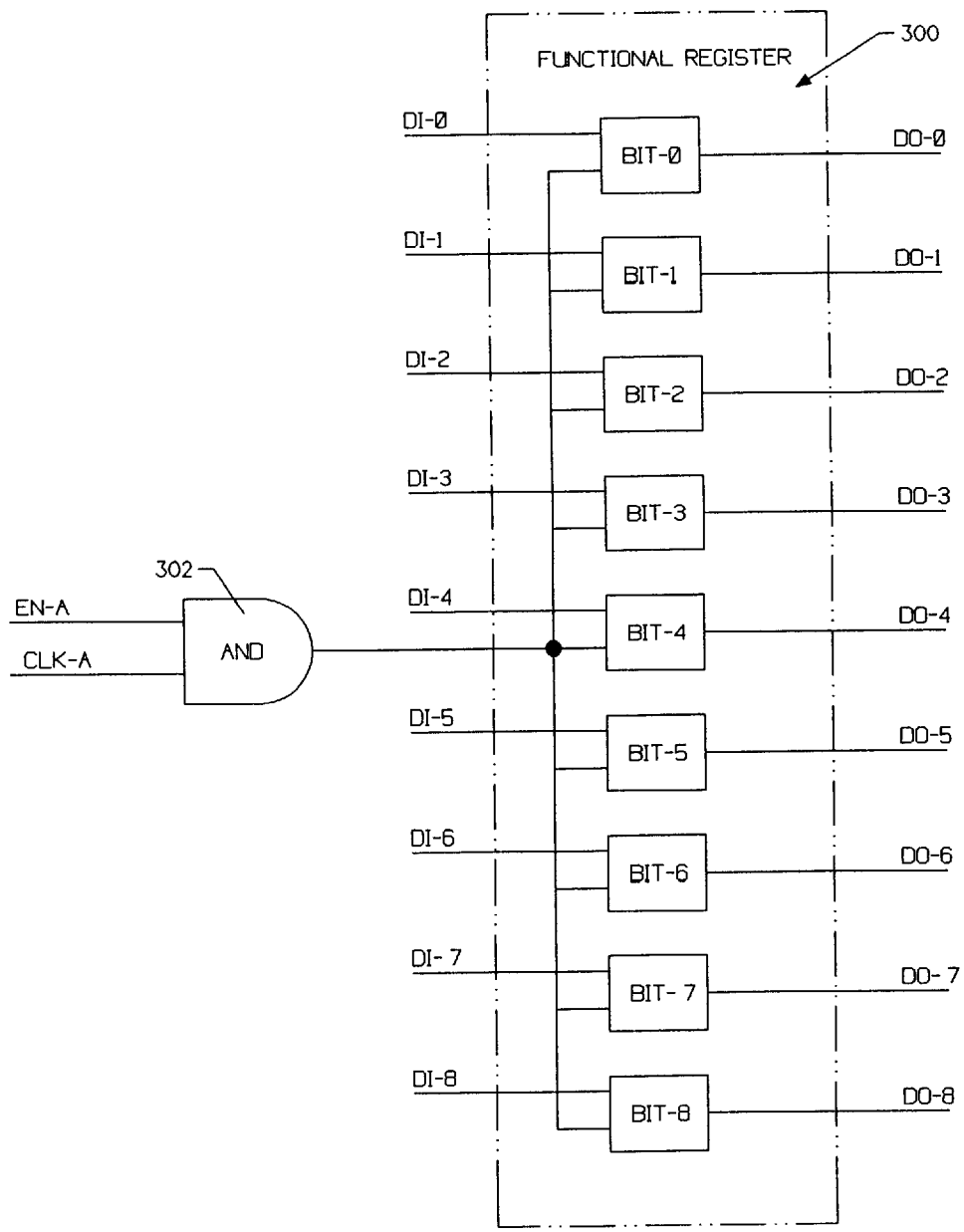
FIG. 7 is a schematic diagram illustrating the benefit of providing a separate gated clock to a number of register bits.

FIG. 7 is a schematic diagram illustrating the benefit of providing a separate gated clock to a number of register bits. A better approach to modeling a memory element with an enable may be to separately model the memory element (latch or flip-flop) and the gated clock portion (or enable). In this configuration, and as shown in FIG. 7, a single gate element 302 may be provided for a number of latch elements 300, thereby reducing the overhead associated with a gated clocking scheme. This method may require that the AND gate 302 be placed physically close to the latches it drives in order to satisfy setup/hold requirements for the gated-clock with respect to the data.

Figure 8:
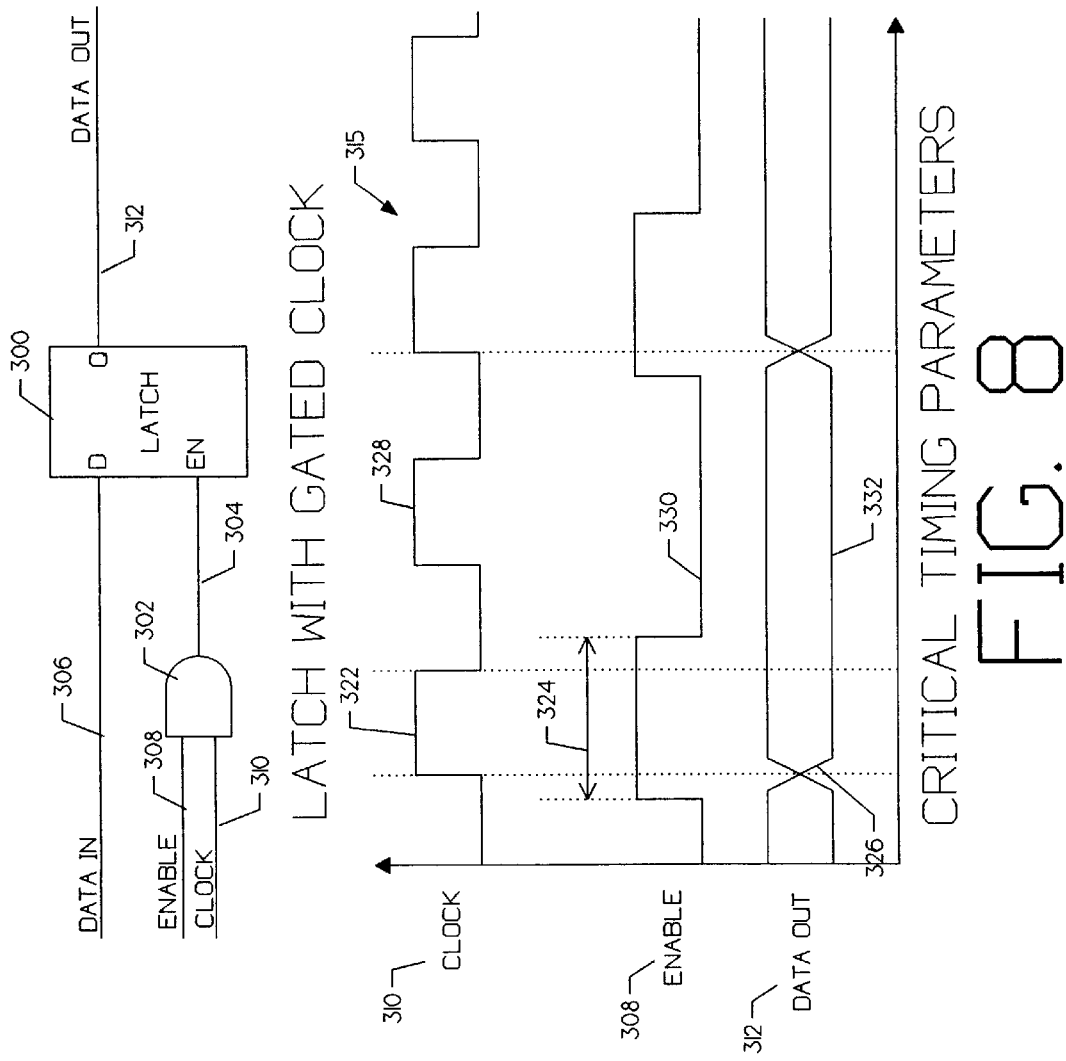
FIG. 8 illustrates a latch having a gated clock and the critical timing parameters therefor.

FIG. 8 illustrates a latch having a gated clock and the critical timing parameters therefor. A latch 300 is shown having a gated clock signal 304 provided thereto. The gated clock signal 304 is generated by anding an enable signal 308 and a raw clock signal 310.

Referring to the timing diagram generally shown at 315, it may be important that the enable signal 308 bridge or envelope the entire clock pulse to prevent a shortened clock period or clock glitches at the latch elements 300. In the illustrative diagram, the clock signal 310 has a clock pulse shown at 322. The enable signal 308 may have a corresponding pulse 320 which may overlap the clock pulse 322 as shown. Since the enable signal 308 typically operates at a lower frequency than the raw clock signal 310, the enable signal 308 may not be subject to the same timing constraints as the raw clock signal.

FIG. 9 is a block diagram illustrating an exemplary model for the AND gate of FIGS. 6–8. As indicated above, typical logic optimizer tools can only handle standard clocking schemes, such as where each register or latch in a design receives a clock signal from a clock source. For high performance designs, however, it is often desirable to use gated clocking schemes to increase the performance of the design. For example, it has been found that a gated clocking scheme can increase the performance of a design by as much as 10 to 20 percent over a design that uses standard clocking schemes.

In a gated clocking scheme, both a clock enable signal 382 and a clock signal 384 may be provided to a logic gate 352, wherein the output of the logic gate 352 may provide a "gated clock signal" 380 to corresponding state devices. For the proper operation of the design, however, the clock enable signal 382 must arrive at the logic gate 352 within a predetermined time relative to the clock signal 384.

Otherwise, and as indicated with reference to FIG. 8, the gated clock signal 380 may not have the expected clock pulse width or may be susceptible to clock glitching that may upset the desired state of the system. Standard optimization tools typically do not have the capability of checking the relative timing of signals arriving at a logic gate. Rather, standard optimization tools typically only have the capability to check the relative timing between signals that arrive at a storage element, such as a register, by using predetermined setup and hold times that are defined for the storage element.

To check the timing of the clock signals relative to the enable signal, the logic gate 352 may be modeled as a storage element 404. Since the standard optimization tool can check the relative timing between signals that arrive at a storage element, the standard optimizer tool may properly check the relative timing between the signals arriving at the logic gate 352. A further discussion of a preferred method and apparatus for optimizing a gated clock structure using a standard optimization tool can be found in co-pending U.S. patent application Ser. No. 08/752,620, filed Nov. 19, 1996, which has been incorporated herein by reference.

Figure 10:
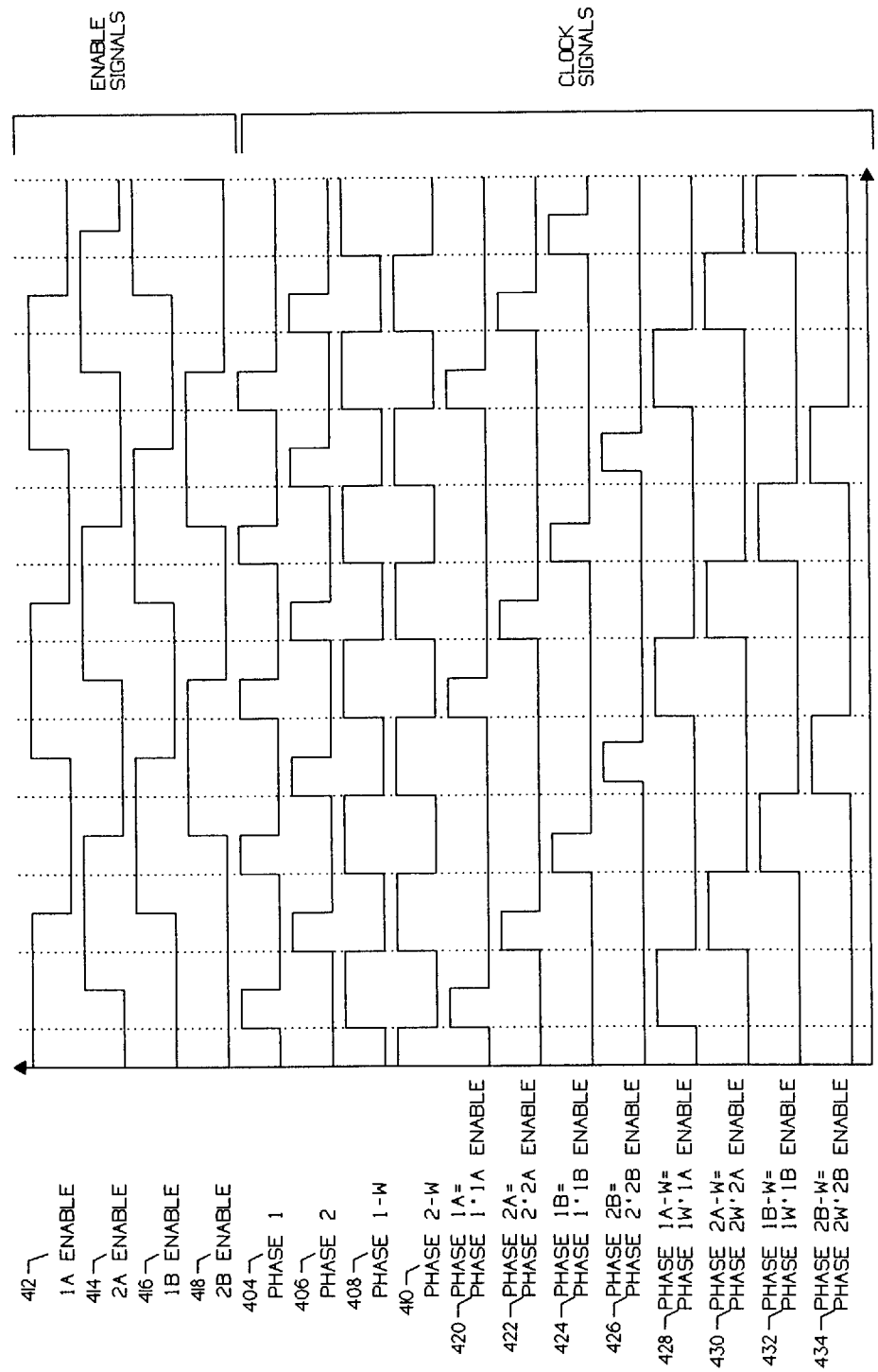
FIG. 10 is a timing diagram showing the generation of a number of gated clock signals from a number of raw clock signals and a number of enable signals.

FIG. 10 is a timing diagram showing the generation of a number of gated clock signals from a number of raw clock signals and a number of enable signals. In the exemplary embodiment, four raw clock signals 404, 406, 408 and 410, and four enable signals 412, 414, 416 and 418 are logically combined to generate eight gated clock signals 420, 422, 424, 426, 428, 430, 432 and 434. The four raw clock signals 404, 406, 408 and 410, and the eight gated clock signals 420, 422, 424, 426, 428, 430, 432 and 434 may be used to clock state devices within a circuit design.

The four raw clock signals include phase-1 404, phase-2 406, phase 1-W 408 and phase 2-W 410. The four enable signals include 1A-Enable 412, 2A-Enable 414, 1B-Enable 416 and 2B-Enable 418. These signals are logically combined to form the eight gated clock signals phase 1A 420 (phase 1 404 and 1A-Enable 412), phase 2A 422 (phase 2 406 and 2A-Enable 414), phase 1B 424 (phase 1 404 and 1B-Enable 416), phase 2B 426 (phase 2 406 and 2B-Enable 418), phase 1A-W 428 (phase 1-W 406 and 1A-Enable 412), phase 2A-W 430 (phase 2-W 410 and 2A-Enable 414), phase 1B-W 432 (phase 1-W 406 and 1B-Enable 416), and phase 2B-W 434 (phase 2-W 410 and 2B-Enable 418). The logical combination of the enable signals and the raw clock signals is preferably provided by an AND gate, wherein the AND gate is located near the destination state devices. This configuration may allow the enable signals 412, 414, 416 and 418 to have a substantially longer period, and therefore may be more readily placed and routed with an auto place and route tool than the raw clock signals 404, 406, 408 and 410. Thus, this configuration may allow the distribution of twelve separate clock signals (e.g., the four raw clocks plus the eight gated clocks) throughout the design, but may only require four clock trees.

Figure 11:
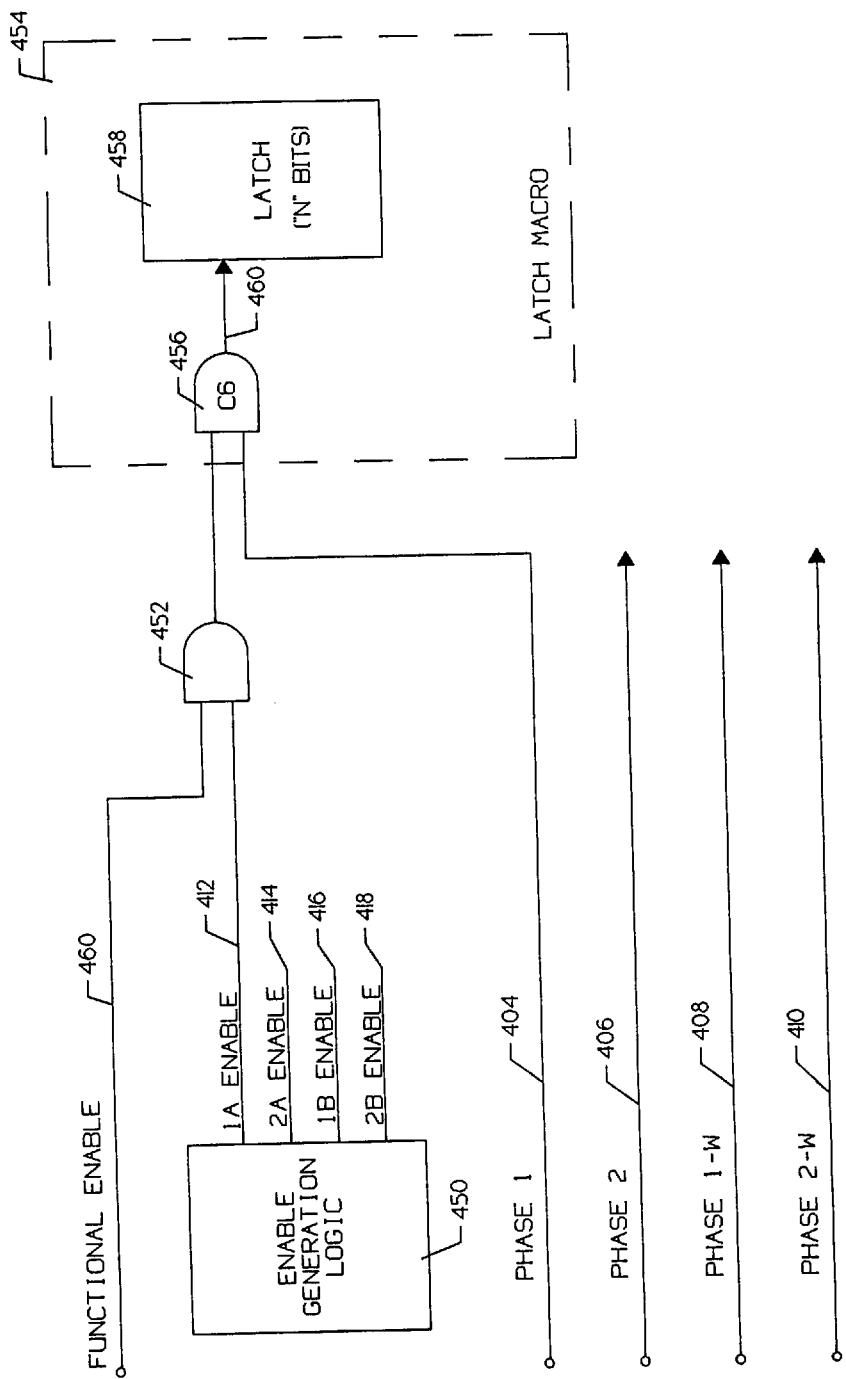
FIG. 11 is a schematic diagram illustrating the logical combination of a raw clock signal and an enable signal to provide a gated clock signal to a latch element.

FIG. 11 is a schematic diagram illustrating the logical combination of a raw clock signal and an enable signal to provide a gated clock signal to a latch element. Four raw clock signals 404, 406, 408 and 410 may be provided, as shown. These signals may be either generated internally or provided from an external source. In either case, the four raw clock signals 404, 406, 408 and 410 each may require a balanced clock tree for effective distribution throughout the circuit design. Similarly, four enable signals 412, 414, 416 and 418 may be provided, as shown. These signals may also be either generated internally by an enable generation logic block 450, or provided from an external source. Unlike the raw clock signals 404, 406, 408 and 410, the enable signals may operate at a lower frequency than the raw clock signals, and thus may not require a separate clock tree for proper distribution throughout the circuit design.

The enable signals 412, 414, 416 and 418 may be combined with a number of functional enable signals to provide a qualified enable signal. For example, the 1A-Enable signal 412 may be logically qualified by functional enable 460 via AND gate 452. AND gate 452 may provide an additional way to further qualify the gated clock signal 460 that is ultimately provided to latch 458.

The output of AND gate 452 may be logically combined with a raw clock signal, for example phase-1A, to provide the gated clock signal 460 that is provided to latch 458. In this case, the 1A-Enable signal 412 is logically combined with phase-1 404 via AND gate 456. With reference to FIG. 10, the anding of phase-1 404 and 1A-Enable 412 results in the gated clock signal phase-1A 420. Thus, in the illustrative embodiment, latch 458 receives gated clock signal phase-1A 420, which is further qualified by functional enable 460.

It is contemplated that AND gate 456 and latch 458 may be provided in a latch macro 454. When instantiating latch macro 454, the user may specify the number of latch bits (from 1 to "N", wherein N is any integer greater than zero). Thus, as described with reference to FIG. 7, AND gate 456 may be associated with more than one latch bit. This may be more efficient than a gated clocking scheme that requires an AND gate for each bit in the circuit design.

Finally, AND gate 456 may be modeled as a storage element for checking the relative timing between the enable signal and the raw clock signal. This is discussed in more detail with reference to FIG. 9.

Figure 12A:
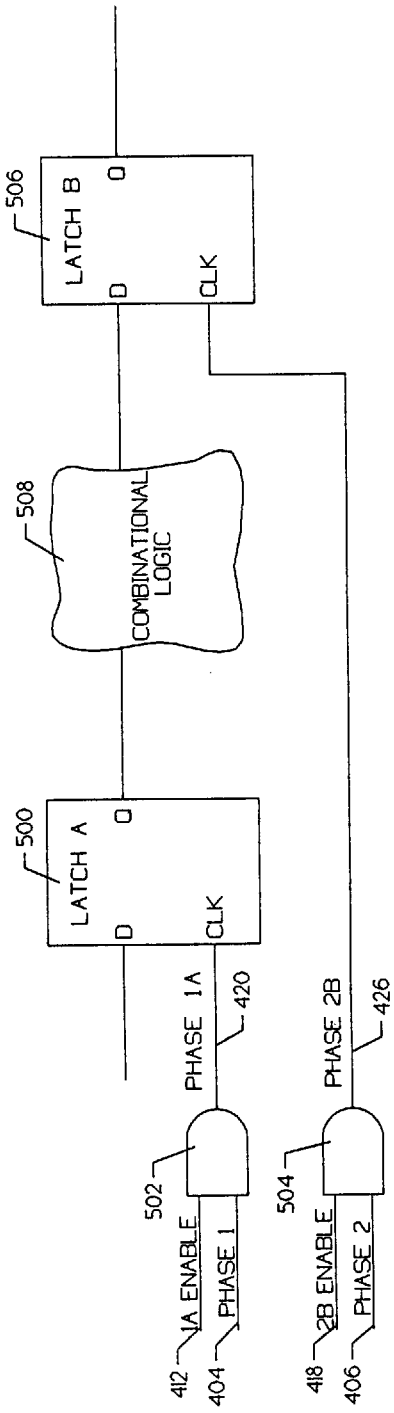
FIG. 12A is a schematic diagram of an exemplary design that uses a gated clocking scheme.

FIG. 12A is a schematic diagram of an exemplary design that uses a gated clock scheme. A first latch 500 is shown having a gated clock phase-1A 420, and a second latch 506 is shown having a gated clock phase-2B 426. The phase-1A 420 is generated by logically combining raw clock signal phase-1 404 and enable signal 1A-enable 412 via AND gate 402. Similarly, gated clock phase-2B 426 is generated by logically combining raw clock signal phase-2 406 and enable signal 2B-enable 418 via AND gate 404.

Figure 12B:
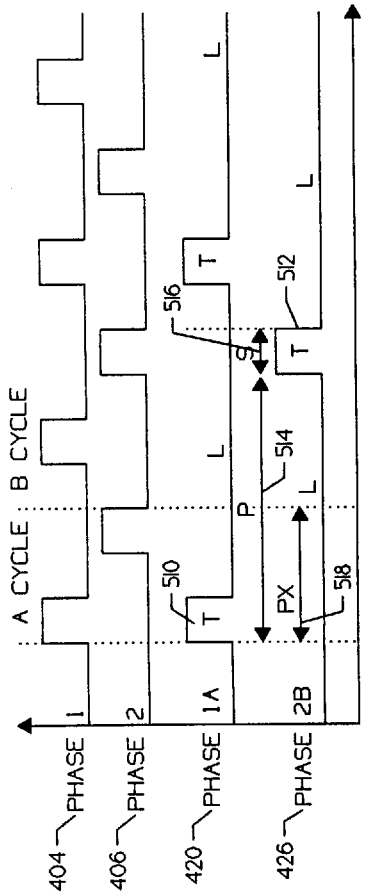
FIG. 12B is a timing diagram showing a number of critical timing parameters for the exemplary design of FIG. 12A.

Referring to FIG. 12B, gated clock phase-1A 420 is asserted as shown at 510, wherein latch 500 becomes transparent, thereby releasing data through combinational logic 508 to the data input of latch 506. Gated clock signal phase-2B 426 is pulsed as shown at 512, thereby capturing the data released by latch 500. Thus, the data released by latch 500 must arrive at latch 506 before latch 506 becomes latched as shown at 512 minus a setup time 516. This delay is shown by propagation time 514.

As indicated above, standard optimizer tools may provide a tracing capability to identify which state devices correspond to which clock signals. However, a limitation of this clock identifying method is that the tracing scheme provided by the logic optimizer tool may not work for designs that use gated clocking schemes. That is, when the raw clock signals phase-1 404 and phase-2 406 are traced to the corresponding state devices 500 and 506, respectively, the clock enable signals 1A-enable 412 and 2B-enable 418 may not be identified or taken into account. Accordingly, the above-referenced clock tracing scheme may incorrectly associate a raw clock signal which each state device, rather than the correct gated clock signal. That is, the above-referenced clock tracing scheme may identify raw clock signal phase-1 404 with latch 500, rather than gated clock signal phase-1A 420. Similarly, the above-referenced clock tracing scheme may identify raw clock signal phase-2 406 with latch 506, rather than gated clock signal phase-2B 426. This may cause the optimizer program to incorrectly optimize the design to a more stringent, incorrect timing constraint. For example, and because the raw clock signals may be associated with latches 500 and 506, the logic optimizer tool may attempt to increase the performance of combinational logic block 508 such that the data released from latch 500 reaches latch 506 before the raw clock signal phase-2 406 is pulsed, as shown at 518. As can readily be seen, improperly associating a raw clock signal rather than a gated signal with a corresponding latch element may cause the logic optimizer tool to incorrectly optimize the design, or provide a false error flag to the user.

Figure 13:
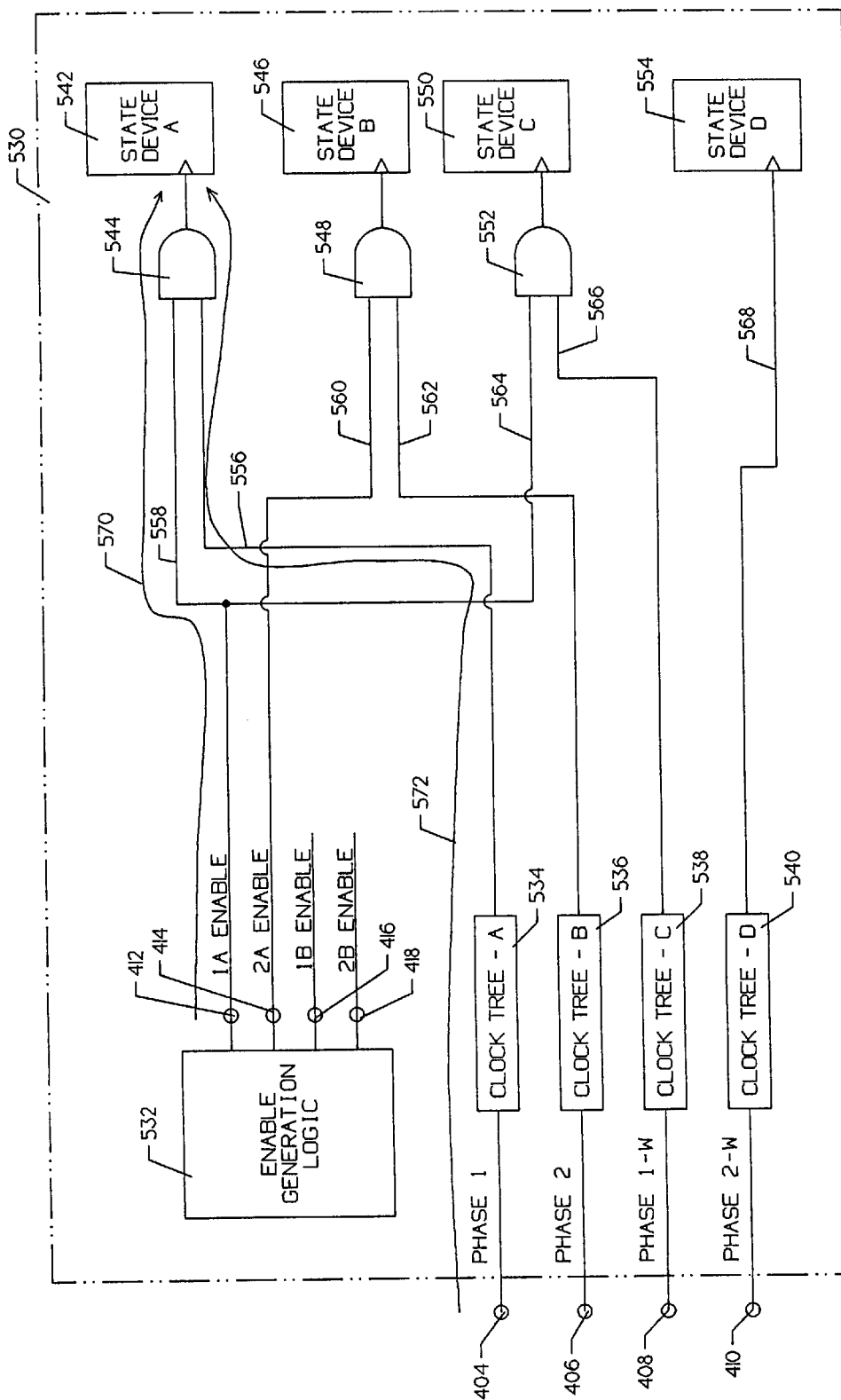
FIG. 13 is a schematic diagram showing an exemplary forward tracing methodology for identifying gated clocks within a circuit design in accordance with the present invention.

FIG. 13 is a schematic diagram showing an exemplary forward tracing methodology for identifying gated clocks within a circuit design in accordance with the present invention. A portion of the circuit design is shown at 530. In the illustrative embodiment, a number of raw clock signals 404, 406, 408 and 410 are provided to the portion of the circuit design 530. The portion of the circuit design may be an ASIC or the like. Each of the raw clock signals is provided to a separate clock tree. For example, raw clock signal phase-1 404 is provided to clock tree 534. The clock trees distribute the corresponding raw clock signals throughout the circuit design.

A number of enable signals are also provided as shown at 412, 414, 416 and 418. In the illustrative embodiment, the enable signals are generated by an enable generation logic block 532. Because the enable signals may operate at a lower frequency than the raw clock signals, clock trees may not be necessary for the proper distribution of these signals.

As indicated above, the enable signals 412, 414, 416 and 418 may be logically combined with the raw clock signals 404, 406, 408 and 410 to form a number of gated clock signals. In the illustrative embodiment, raw clock signal 404 is provided to AND gate 544 via clock tree 534. Similarly, enable signal 1A-enable 412 is provided to AND gate 544 via interface 558. AND gate 544 logically combines the enable signal 1A-enable 412 and raw clock signal phase-1 404 to provide a gated clock signal to state device 542, as shown. Similarly, AND gate 548 logically combines raw clock signal phase-2 406 and enable signal 2A-enable 414 to provide a gated clock signal to state device 546. AND gate 552 logically combines raw clock signal phase-1W 408 and enable signal 1A-enable 412 to provide a gated clock signal to state device 550. Finally, state device 554 is directly coupled to raw clock signal phase-2W 410.

In accordance with an exemplary embodiment of the present invention, the tracing capability of a logic optimizer tool may be utilized to trace from a number of pre-identified clock and/or enable nets to the corresponding state devices. In a preferred mode, the user may identify all of the enable signals 412, 414, 416 and 418, and all raw clock signals 404, 406, 408 and 410. The tracing capability of the logic optimizer tool may then be used to trace from each of these pre-identified nets to the corresponding state devices. For example, the tracing capability of a logic optimizer tool may trace from the enable signal 1A-enable 412 to each of the corresponding state devices, including state device 542, as shown at 570. Similarly, the tracing capability of the logic optimizer tool may be used to trace from raw clock signal 404, through clock tree 534 and to state device 542, as shown at 572. Although not shown explicitly in FIG. 13, the tracing capability of the logic optimizer tool may trace all of the other enable signals 414, 416 and 418, and all of the other raw clock signals 406, 408 and 410 to the corresponding state devices. Thereafter, each state device that has a gated clock signal provided thereto may be at the destination of one enable signal and one raw clock signal. For example, state device 542 is at the destination for enable signal 1A-enable 412 and raw clock signal phase-1 404. The particular combination of enable signal and raw clock signal may uniquely identify a corresponding gated clock signal. For example, the combination of enable signal 1A-enable 412 and raw clock signal phase-1 404 may uniquely identify gated clock signal phase-1A (see, FIG. 10). The uniquely identified gated clock signal may then be provided to the logic optimizer tool for the optimization process.

It is contemplated that a separate tool or apparatus may be used to perform the tracing function described above, rather than using a tracing capability of an optimization tool.

FIG. 14A is a table showing the results of an exemplary forward tracing methodology in accordance with the present invention, including a number of predefined initial pins and the corresponding destination state devices for the circuit shown in FIG. 13. The table is generally shown at 590, wherein the trace number is shown at column 592, the initial pin is shown at column 594, and the destination state device is shown at 596. During a first trace 598, the tracing capability of the logic optimizer tool may trace from initial pin phase-1 404 to state device 542 (see, FIG. 13). Similarly, during a fifth trace 604, the tracing capability of the logic optimizer tool may trace from initial pin 1A-enable 412 to state device 542 and state device 550 (see, FIG. 13). Each of the trace numbers shown in column 592 represents a separate trace beginning at each of the enable or raw clock signal nets.

FIG. 14B is a table showing the logical correspondence between a number of exemplary raw clock signals and a number of exemplary enable signals. The table is generally shown at 620, and the number of raw clock signals are shown across the top at 622. The number of enable signals are shown along the left at 624. As indicated with reference to FIG. 10, the logical combination of predetermined raw clock signals and predetermined enable signals uniquely identifies a gated clock signal. For example, the raw clock signal phase-1 ANDED with the enable signal 1A-enable uniquely identifies the gated clock signal phase-1A, as shown at 625.

The table shown in FIG. 14B may be used to determine which of the gated clock signals should be assigned to the state devices within the circuit design. For example, and with reference to FIG. 14A, state device A 542 is a destination device for traces beginning at raw clock signal phase-1 404 and enable signal 1A-enable 412. Thus, state device A 542 is controlled by gated clock phase-1A 625. This is further illustrated in FIG. 14C below.

FIG. 14C is a table showing the resulting gated clocks assigned to each state device shown in FIG. 13, using the tables shown in FIGS. 14A and 14B. The table is generally shown at 630. Each state device of FIG. 13 is shown in the left hand column of FIG. 14C. The corresponding gated clock signal is shown in the right hand column of FIG. 14C. For example, state device A 542 is a destination device for trace No. 1 and trace No. 5. The initial pin in trace No. 1 is raw clock signal phase-1 404, and the initial pin of trace No. 5 is enable signal 1A-enable 412. Thus, referring to FIG. 14B, this combination uniquely identifies gated clock signal phase-1A, as shown at 634. Similarly, state device B 546 is a destination device for trace No. 2 and trace No. 6. Trace No. 2 has an initial pin of raw clock signal phase-2 406, and trace No. 6 has an initial pin of enable signal 2A-enable 414. Thus, and with reference to FIG. 14B, this combination uniquely identifies gated clock signal phase-2A, as shown at 638. State device C 550 is a destination device for trace No. 3 and trace No. 5. Trace No. 3 has an initial pin of raw clock signal phase-1W 408, and trace No. 5 has an initial pin of enable signal 1A-enable 412. Thus, and with reference to FIG. 14B, this combination uniquely identifies gated clock signal phase-1A-W, as shown at 642. Finally, state device D 554 is only a destination device for trace No. 4. Trace No. 4 has an initial pin of raw clock signal phase-2-W. Thus, the assigned clock signal to state device 554 is phase-2-W, as shown at 546.

Figure 15:
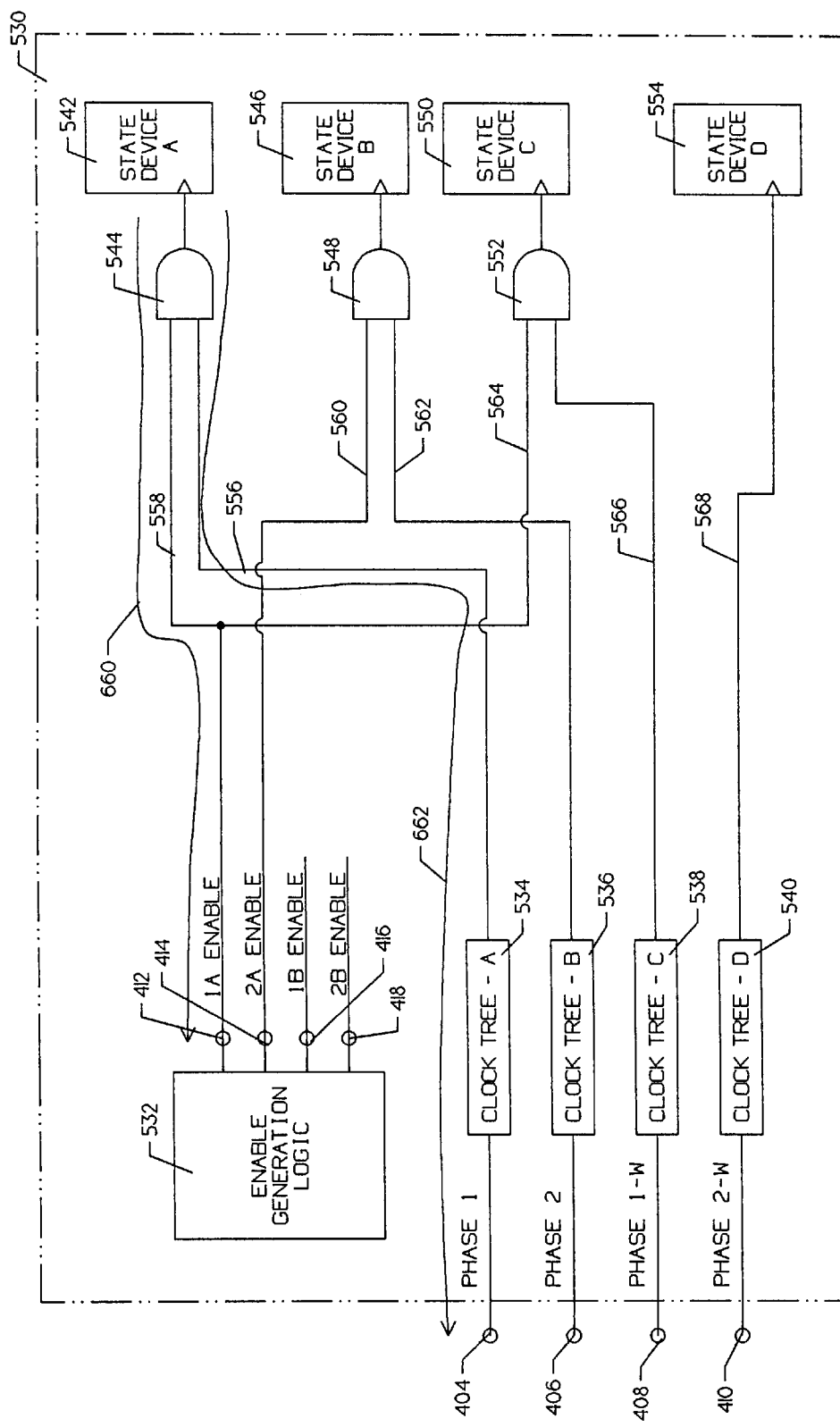
FIG. 15 is a schematic diagram showing an exemplary backward tracing methodology for identifying gated clocks within a circuit design in accordance with the present invention.

FIG. 15 is a schematic diagram showing an exemplary backward tracing methodology for identifying gated clocks within a circuit design in accordance with the present invention. A portion of the circuit design is shown at 530. In the illustrative embodiment, a number of raw clock signals 404, 406, 408 and 410 are provided to the portion of the circuit design 530. The portion of the circuit design may be an ASIC or the like. Each of the raw clock signals is provided to a separate clock tree. For example, raw clock signal phase-1 404 is provided to clock tree 534. The clock trees distribute the corresponding raw clock signals throughout the circuit design.

A number of enable signals are also provided as shown at 412, 414, 416 and 418. In the illustrative embodiment, the enable signals are generated by an enable generation logic block 532. Because the enable signals may operate at a lower frequency than the raw clock signals, clock trees may not be necessary for the proper distribution of these signals.

As indicated above, the enable signals 412, 414, 416 and 418 may be logically combined with the raw clock signals 404, 406, 408 and 410 to form a number of gated clock signals. In the illustrative embodiment, raw clock signal 404 is provided to AND gate 544 via clock tree 534. Similarly, enable signal 1A-enable 412 is provided to AND gate 544 via interface 558. AND gate 544 logically combines the enable signal 1A-enable 412 and raw clock signal phase-1 404 to provide a gated clock signal to state device 542, as shown. Similarly, AND gate 548 logically combines raw clock signal phase-2 406 and enable signal 2A-enable 414 to provide a gated clock signal to state device 546. AND gate 552 logically combines raw clock signal phase-1W 408 and enable signal 1A-enable 412 to provide a gated clock signal to state device 550. Finally, state device 554 is directly coupled to raw clock signal phase-2W 410.

In accordance with an exemplary embodiment of the present invention, the tracing capability of a logic optimizer tool may be utilized to trace from a number of state devices back to pre-identified clock and/or enable nets. In a preferred mode, the user may identify all of the enable signals 412, 414, 416 and 418, and all raw clock signals 404, 406, 408 and 410. The tracing capability of the logic optimizer tool may then be used to trace from each state device back to the pre-identified enable and raw clock signals. For example, the tracing capability of a logic optimizer tool may trace from state device 542 back to each of the corresponding enable signals, including enable signal 1A-enable 412, as shown at 660. Similarly, the tracing capability of the logic optimizer tool may be used to trace from state device 542 back to each of the corresponding raw clock signals, including raw clock signal 404, as shown at 662. Although not shown explicitly in FIG. 15, the tracing capability of the logic optimizer tool may trace from all other state devices 546, 550 and 554 back to the corresponding enable signals and raw clock signals. As a result, each state device that has a gated clock signal provided thereto may be have one enable signal and one raw clock signal associated therewith. For example, state device 542 may trace back to both enable signal 1A-enable 412 and raw clock signal phase-1 404. The particular combination of enable signal and raw clock signal may uniquely identify a corresponding gated clock signal. For example, the combination of enable signal 1A-enable 412 and raw clock signal phase-1 404 may uniquely identify gated clock signal phase-1A (see, FIG. 10). The uniquely identified gated clock signal may then be provided to the logic optimizer tool for the optimization process.

It is contemplated that a separate tool or apparatus may be used to perform the tracing function described above, rather than using a tracing capability of an optimization tool.

FIG. 16A is a table showing the results of an exemplary backward tracing methodology in accordance with the present invention, including a number of initial state devices and the corresponding destination pins for the circuit shown in FIG. 15. The table is generally shown at 700, wherein the trace number is shown at column 702, the initial state device is shown at column 704, and the destination pin is shown at column 706. During a first trace 708, the tracing capability of the logic optimizer tool may trace from initial state device 542 to destination pin phase-1 404, as shown at 712 (see, FIG. 15). Similarly, and also during the first trace 708, the tracing capability of the logic optimizer tool may trace from initial state device 542 to destination pin 1A-enable 412 (see, FIG. 15). Each of the trace numbers shown in column 702 represents a number of traces beginning at each of the state devices 542, 546, 550 and 554, respectively.

FIG. 16B is a table showing the logical correspondence between a number of exemplary raw clock signals and a number of exemplary enable signals. The table is generally shown at 620, and the number of raw clock signals are shown across the top at 622. The number of enable signals are shown along the left at 624. As indicated with reference to FIG. 10, the logical combination of predetermined raw clock signals and predetermined enable signals uniquely identifies a gated clock signal. For example, the raw clock signal phase-1 ANDED with the enable signal 1A-enable uniquely identifies the gated clock signal phase-1A, as shown at 625.

The table shown in FIG. 16B may be used to determine which of the gated clock signals should be assigned to the state devices within the circuit design. For example, and with reference to FIG. 16A, raw clock signal phase-1 404 and enable signal 1A-enable 412 are destination pins for state device A 542. Thus, state device A 542 is controlled by gated clock phase-1A 625. This is further illustrated in FIG. 16C below.

FIG. 16C is a table showing the resulting gated clocks assigned to each state device shown in FIG. 15, using the tables shown in FIGS. 16A and 16B. The table is generally shown at 730. Each state device of FIG. 15 is shown in the left hand column of FIG. 16C. The corresponding gated clock signal is shown in the right hand column of FIG. 16C.

Raw clock signal phase-1 404 and enable signal 1A-enable 412 are destination pins for trace No. 1 from initial state device 542. Thus, referring to FIG. 16B, this combination uniquely identifies gated clock signal phase-1A, as shown at 738. The gated clock signals for each of the other state devices 546, 550 and 554 may be similarly determined.

Figure 17:
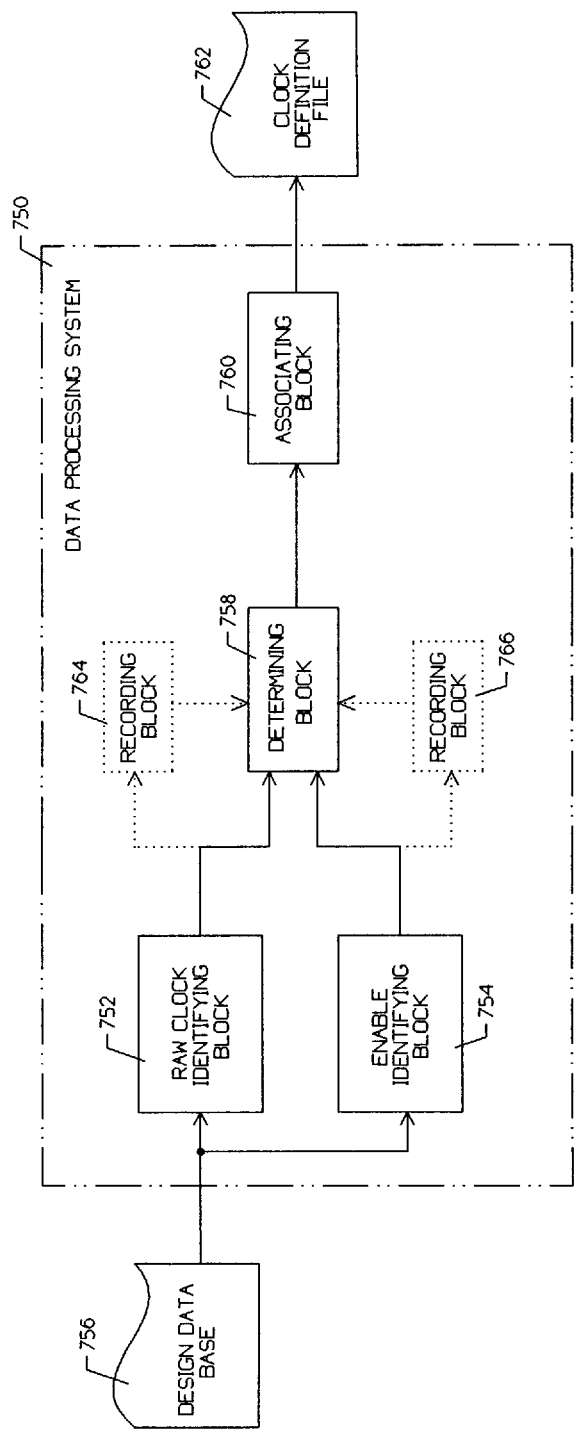
FIG. 17 is a block diagram of an exemplary data processing system in accordance with the present invention.

FIG. 17 is a block diagram of an exemplary data processing system in accordance with the present invention. The data processing system is shown at 750, and may include a raw clock identifying block 752, an enable identifying block 754, a determining block 758, and an associating block 760.

The data processing system 750 may read a design database 756, and provide the design database 756 to raw clock identifying block 752 and enable identifying block 754. The raw clock identifying block 752 may identify which of the number of state devices within the design database 756 are coupled to which of the number of raw clock signals. Similarly, the enable identifying block 754 may identify which of the number of state devices within the design database 756 are coupled to which of the number of enable signals. As indicated above, each of the number of gated clock signals may be uniquely identified by the particular logical combination of raw clock signals and enable signals. Determining block 758 may, for each state device within the design database 756, determine which of the gated clock signals is uniquely determined by noting which of the raw clock signals and which of the enable signals, if any, correspond to a particular state device. Associating block 760 may associate the particular gated clock signal determined by determining block 758 with the corresponding state devices. This association may be provided to a clock definition file 762, as shown.

It is contemplated that raw clock identifying block 752 may record which of the number of state devices are coupled to which of the number of raw clock signals. This may be accomplished via recording block 764. Similarly, it is contemplated that enable identifying block 754 may record which of the number of state devices are coupled to which of the number of enable signals. This may be accomplished via recording block 766.

Figure 18:
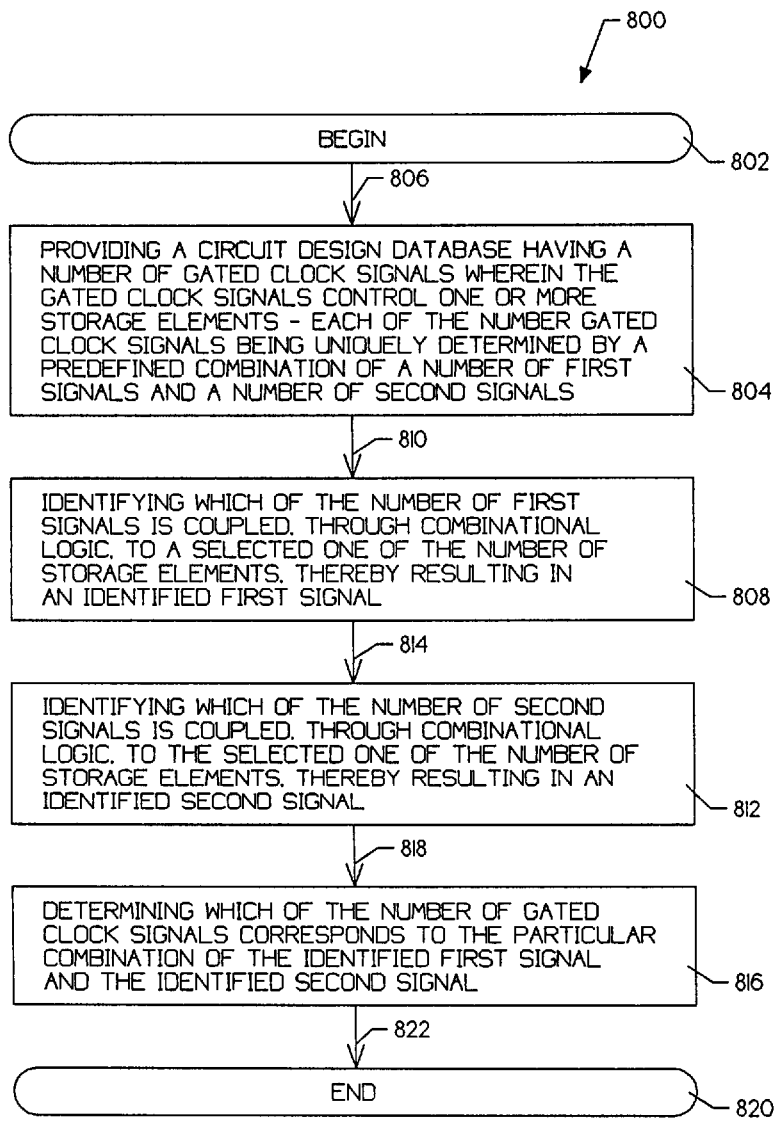
FIG. 18 is a flow diagram showing a first exemplary method of the present invention.

FIG. 18 is a flow diagram showing a first exemplary method of the present invention. The diagram is generally shown at 800 and is entered at element 802. Control is then passed to element 804 via interface 806. Element 804 provides a circuit design database having a number of gated, and non-gated, clock signals, wherein the clock signals control one or more storage elements. Each of the number of gated clock signals is uniquely determined by a predefined combination of a number of first signals and a number of second signals. The number of first signals may be raw clock signals, and the number of second signals may be enable signals. Control is then passed to element 808 via interface 810. Element 808 identifies which of the number of first signals is coupled, via combinational logic, to a selected one of the number of storage elements, thereby resulting in an identified first signal. Control is then passed to element 812 via interface 814. Element 812 identifies which of the number of second signals is coupled, through combinational logic, to the selected one of the number of storage elements, thereby resulting in an identified second signal. Control is then passed to element 816 via interface 818. Element 816 determines which of the number of gated clock signals corresponds to the particular combination of the identified first signal and the identified second signal. Control is then passed to element 820 via interface 822, wherein the algorithm is exited.

Figure 19:
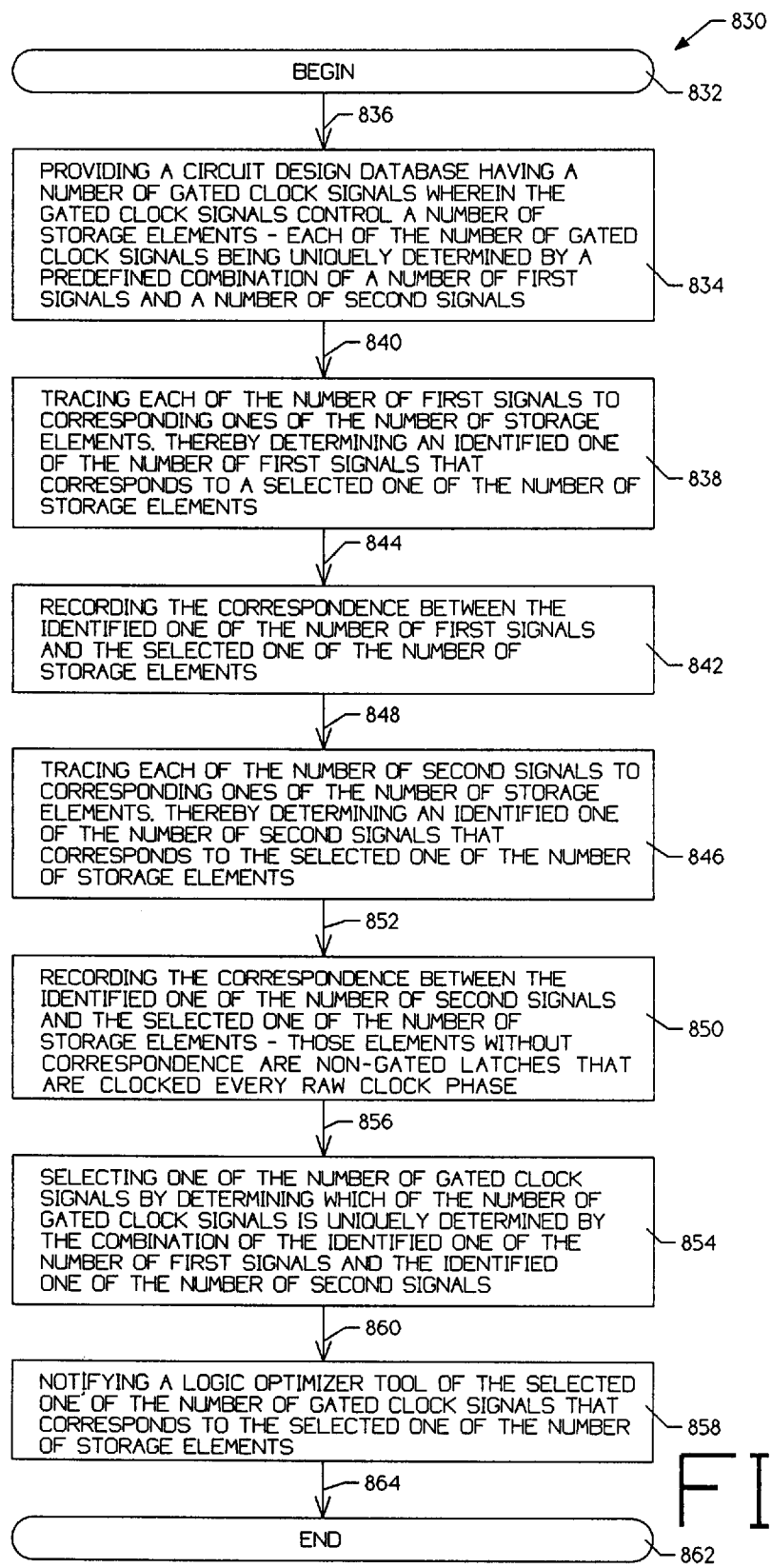
FIG. 19 is a flow diagram showing a second exemplary method of the present invention.

FIG. 19 is a flow diagram showing a second exemplary method of the present invention. The diagram is generally shown at 830, wherein it is entered at element 832. Control is passed to element 834 via interface 836. Element 834 provides a circuit design having a number of gated, and non-gated, clock signals, wherein the clock signals control a number of storage elements. Each of the number of gated clock signals is uniquely determined by a predefined combination of a number of first signals and a number of second signals. The number of first signals may be a number of raw clock signals, and the number of second signals may be a number of enable signals. Control is then passed to element 838 via interface 840. Element 838 traces each of the number of first signals to corresponding one of the number of storage elements, thereby determining an identified one of the number of first signals that corresponds to a selected one of the number of storage elements. Control is then passed to element 842 via interface 844. Element 842 records the correspondence between the identified one of the number of first signals and the selected one of the number of storage elements. Control is then passed to element 846 via interface 848. Element 846 traces each of the number of second signals, if any, to corresponding ones of the number of storage elements, thereby determining an identified one of the number of second signals that corresponds to the selected one of the number of storage elements. Control is then passed to element 850 via interface 852. Element 850 records the correspondence between the identified one of the number of second signals and the selected one of the number of storage elements. Those elements without correspondence are non-gated latches that are clocked every raw clock phase. Control is then passed to element 854 via interface 856. Element 854 selects one of the number of gated clock signals by determining which of the number of gated clock signals is uniquely determined by the combination of the identified one of the number of first signals and the identified one of the number of second signals. The storage elements that are recorded as corresponding to one of the first signals (e.g., raw clock signals), but are not recorded as corresponding to one of the second signals (e.g., enables) have an un-gated clock signal and are clocked every raw clock period. Control is then passed to element 858 via interface 860. Element 858 notifies a logic optimizer tool of the selected one of the number of gated clock signals that corresponds to the selected one of the number of storage elements. Control is then passed to element 862 via interface 864, wherein the algorithm is exited.

Figure 20:
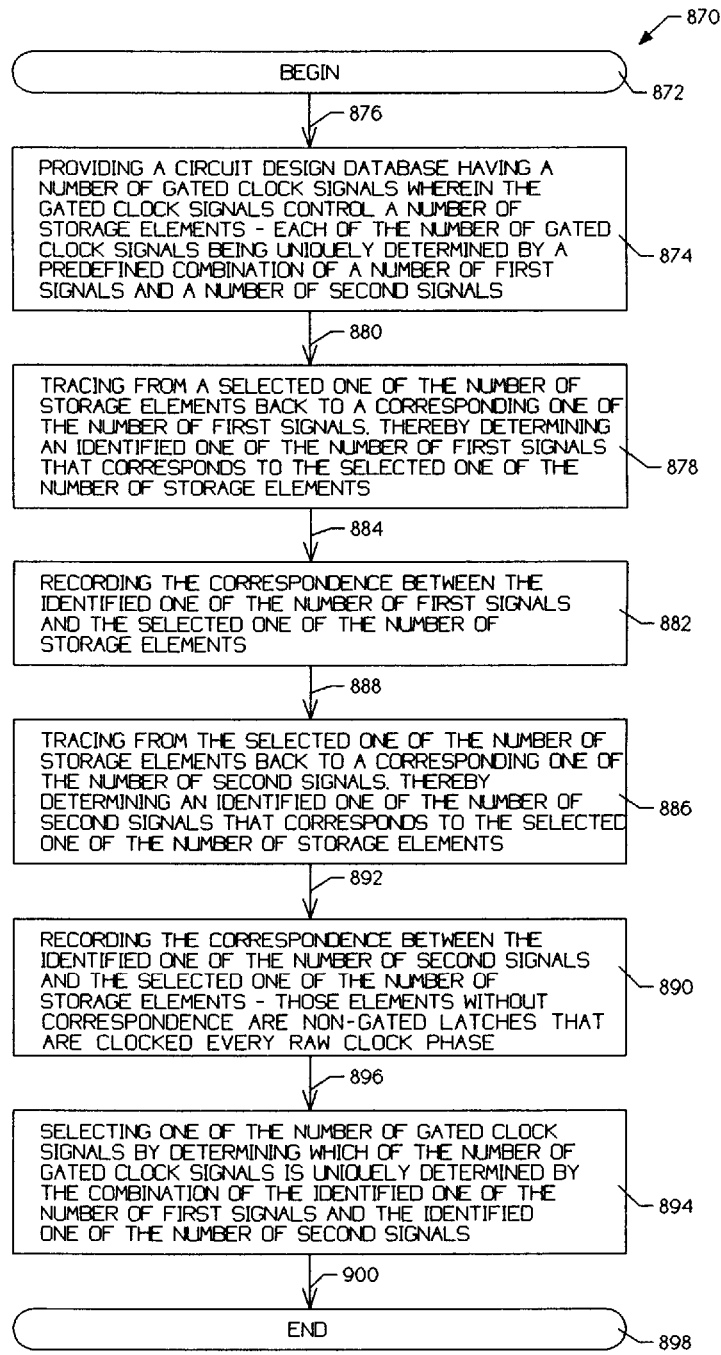
FIG. 20 is a flow diagram showing a third exemplary method of the present invention.

FIG. 20 is a flow diagram showing a third exemplary method of the present invention. The diagram is generally shown at 870 and is entered at element 872. Control is then passed to element 874 via interface 876. Element 874 provides a circuit design database having a number of gated clock signals, wherein the gated clock signals control a number of storage elements. Each of the number of gated clock signals is uniquely determined by a predefined combination of a number of first signals and a number of second signals. Control is then passed to element 878 via interface 880. Element 878 traces from a selected one of the number of storage elements back to a corresponding one of the number of first signals, thereby determining an identified one of the number of first signals that corresponds to the selected one of the number of storage elements. Control is then passed to element 882 via interface 884. Element 882 records the correspondence between the identified one of the number of first signals and the selected one of the number of storage elements. Control is then passed to element 886 via interface 888. Element 886 traces from the selected one of the number of storage elements back to a corresponding one of the number of second signals, thereby determining an identified one of the number of second signals that corresponds to the selected one of the number of storage elements. Control is then passed to element 890 via interface 892. Element 890 records the correspondence between the identified one of the number of second signals and the selected one of the number of storage elements. Those elements without correspondence are non-gated latches that are clocked every raw clock phase. Control is then passed to element 894 via interface 896. Element 894 selects one of the number of gated clock signals by determining which of the number of gated clock signals is uniquely determined by the combination of the identified one of the number of first signals and the identified one of the number of second signals. The storage elements that are recorded as corresponding to one of the first signals (e.g., raw clock signals), but are not recorded as corresponding to one of the second signals (e.g., enables) have an un-gated clock signal and are clocked every raw clock period. Control is then passed to element 898 via interface 900, wherein the algorithm is exited.

Figure 21:
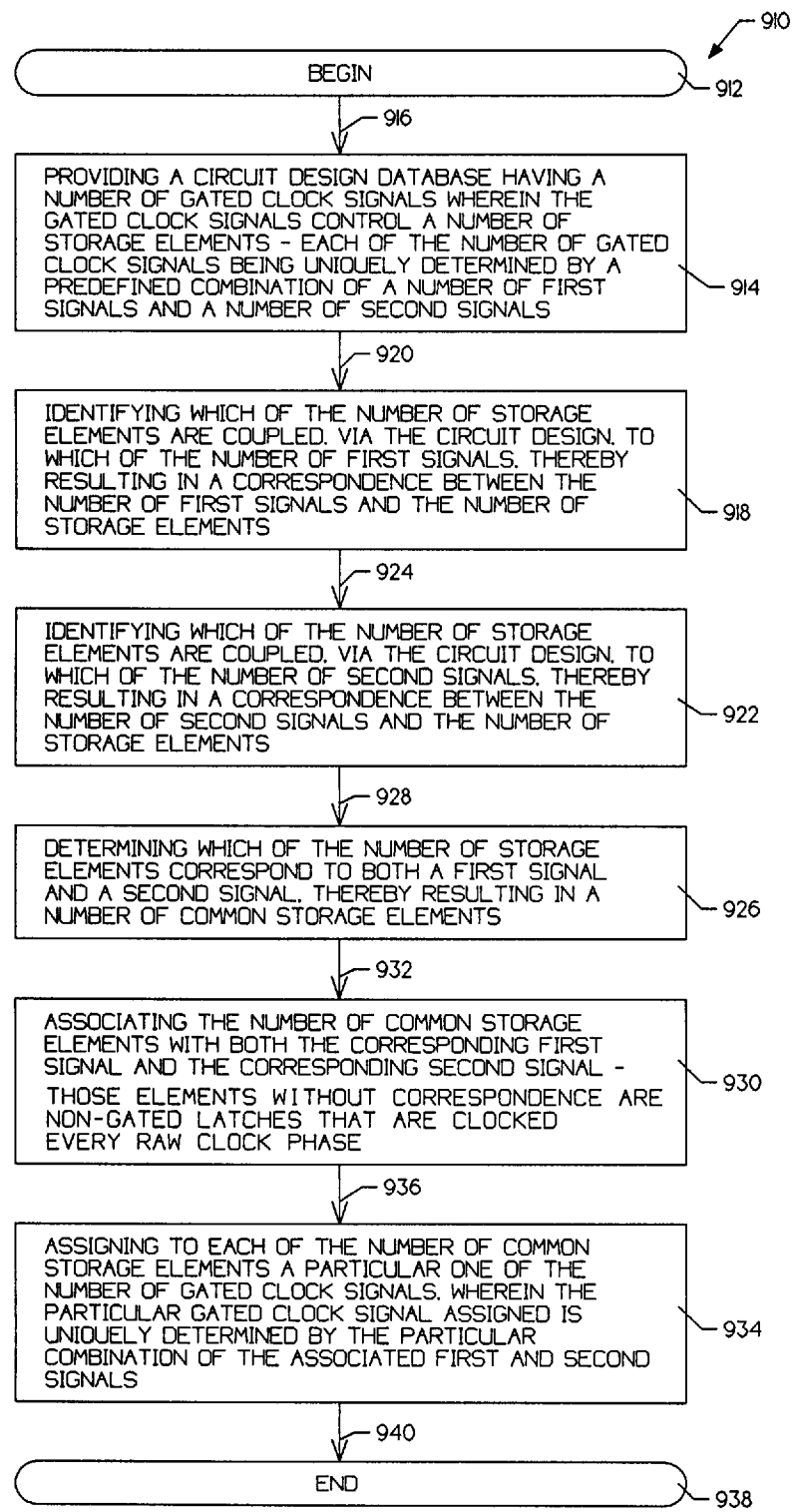
FIG. 21 is a flow diagram showing a fourth exemplary method of the present invention.

FIG. 21 is a flow diagram showing a fourth exemplary method of the present invention. The diagram is generally shown at 910 and is entered at element 912. Control is then passed to element 914 via interface 916. Element 914 provides a circuit design database having a number of gated clock signals, wherein the gated clock signals control a number of storage elements. Each of the number of gated clock signals is uniquely determined by a predefined combination of a number of first signals and a number of second signals. The number of first signals may be a number of raw clock signals, and the number of second signals may be a number of enable signals. Control is then passed to element 918 via interface 920. Element 918 identifies which of the number of storage elements are coupled, via the circuit design, to which of the number of first signals, thereby resulting in a correspondence between the number of first signals and the number of storage elements. Control is then passed to element 922 via interface 924. Element 922 identifies which of the number of storage elements are coupled, via the circuit design, to which of the number of second signals, thereby resulting in a correspondence between the number of second signals and the number of storage elements. Control is then passed to element 926 via interface 928. Element 926 determines which of the number of storage elements correspond to both a first signal and a second signal, thereby resulting in a number of common storage elements. Control is then passed to element 930 via interface 932. Element 930 associates the number of common storage elements with both the corresponding first signal and the corresponding second signal. Those elements without correspondence are non-gated latches that are clocked every raw clock phase. Control is then passed to element 934 via interface 936. Element 934 assigns to each of the number of common storage elements a particular one of the number of gated clock signals, wherein the particular gated clock signal that is assigned is uniquely determined by the particular combination of the associated first and second signals. The storage elements that are recorded as corresponding to one of the first signals (e.g., raw clock signals), but are not recorded as corresponding to one of the second signals (e.g., enables) have an un-gated clock signal and are clocked every raw clock period. Control is then passed to element 938 via interface 940, wherein the algorithm is exited.

Having thus described the preferred embodiments of the present invention, those of skill in the art will readily appreciate that the teachings found herein may be applied to yet other embodiments within the scope of the claims hereto attached.

What is claimed is:

1. Apparatus for identifying gated clocks in a circuit design, wherein the circuit design has a number of state devices, the circuit design includes a number of first signals and a number of second signals wherein selected ones of the number of first signals and selected ones of the number of second signals are logically combined, via combinational logic, to provide a number of gated clock signals, each of the number of gated clock signals is uniquely identified by the particular logical combination of the number of first and second signals, selected ones of the number of state devices receiving at least one of the number of gated clock signals, the improvement comprising:

a. first identifying means for identifying which of the number of state devices are coupled, via the circuit design, to a first one of the number of first signals, thereby resulting in a number of first identified state devices;

b. second identifying means for identifying which of the number of state devices are coupled, via the circuit design, to a first one of the number of second signals, thereby resulting in a number of second identified state devices;

c. determining means coupled to said first and second identifying means for determining if any of the number of first identified state devices are the same state devices as the number of second identified state devices, and if so, identifying those as common state devices; and d. associating means coupled to said determining means for associating the particular gated clock signal that is uniquely identified by the particular logical combination of the first one of the number of first signals and the first one of the number of second signals with each of the common state devices.

2. Apparatus according to claim 1 wherein said first identifying means comprises a first net tracing means for tracing the first one of the first signals through the circuit design to corresponding ones of the number of state devices.

3. Apparatus according to claim 2 wherein said first net tracing means is provided by an optimization tool.

4. Apparatus according to claim 2 wherein said second identifying means comprises a second net tracing means for tracing the first one of the second signals through the circuit design to corresponding ones of the number of state devices.

5. Apparatus according to claim 4 wherein said second net tracing means is provided by an optimization tool.

6. Apparatus according to claim 1 further comprising a first recording means coupled to said first identifying means for recording which of the number of state devices are identified as being coupled to the first one of the number of first signals.

7. Apparatus according to claim 6 further comprising a second recording means coupled to said second identifying means for recording which of the number of state devices are identified as being coupled to the first one of the number of second signals.

8. Apparatus according to claim 1 wherein the number of first signals comprise a number of raw clock signals.

9. Apparatus according to claim 8 wherein the number of second signals comprise a number of enable signals.

10. Apparatus according to claim 9 wherein each of said number of raw clock signals are distributed through the circuit design via a clock tree.

11. Apparatus according to claim 10 wherein said number of enable signals are driven through the circuit design via combinational logic that is routed via an automatic place and route tool.

12. Apparatus according to claim 1 wherein selected ones of the number of first signals and the selected ones of the number of second signals are logically combined using a logic gate to generate selected ones of the number of gated clocks.

13. Apparatus according to claim 12 wherein said logic gate comprises an AND gate.

14. Apparatus for identifying gated clocks in a circuit design, wherein the circuit design has a number of state devices, the circuit design includes a number of first signals and a number of second signals wherein selected ones of the number of first signals and selected ones of the number of second signals are logically combined, via combinational logic, to provide a number of gated clock signals, each of the number of gated clock signals is uniquely identified by the particular logical combination of the number of first and second signals, selected ones of the number of state devices receiving at least one of the number of gated clock signals, the improvement comprising:

a. first identifying means for identifying which of the number of state devices are coupled, via the circuit design, to which of the number of first signals, thereby resulting in a correspondence between the number of first signals and the number of state devices;

b. second identifying means for identifying which of the number of state devices are coupled, via the circuit design, to which of the number of second signals, thereby resulting in a correspondence between the number of second signals and the number of state devices;

c. determining means coupled to said first and second identifying means for determining which of the number of state devices correspond to both a first signal and a second signal, thereby resulting in a number of common state devices; and d. associating means coupled to said determining means for associating the number of common state devices with both the corresponding first signal and the corresponding second signal, and assigning to each of the number of common state devices a particular one of the number of gated clock signals, wherein the particular gated clock signal assigned is uniquely determined by the particular combination of the associated first and second signals.

15. Apparatus according to claim 14 wherein said first identifying means comprises a first net tracing means for tracing each of the first signals through the circuit design to corresponding ones of the number of state devices.

16. Apparatus according to claim 15 wherein said first net tracing means is provided by an optimization tool.

17. Apparatus according to claim 15 wherein said second identifying means comprises a second net tracing means for tracing each of the second signals through the circuit design to corresponding ones of the number of state devices.

18. Apparatus according to claim 17 wherein said second net tracing means is provided by an optimization tool.

19. Apparatus according to claim 14 further comprising a first recording means coupled to said first identifying means for recording the correspondence between the number of first signals and the number of state devices.

20. Apparatus according to claim 19 further comprising a second recording means coupled to said second identifying means for recording the correspondence between the number of second signals and the number of state devices.

21. Apparatus for identifying gated clocks in a circuit design, wherein the circuit design has a number of state devices and each state device has at least one clock input, the circuit design includes a number of first signals and a number of second signals wherein selected ones of the number of first signals and selected ones of the number of second signals are logically combined, via combinational logic, to provide a number of gated clock signals, each of the number of gated clock signals is uniquely identified by the particular logical combination of the number of first and second signals, selected ones of the number of state devices receiving at least one of the number of gated clock signals via the corresponding clock input, the improvement comprising:

a. first identifying means for identifying which of the number of first signals is coupled, via the circuit design, to a selected clock input of a first one of the number of state devices, thereby resulting in an identified first signal;

b. second identifying means for identifying which of the number of second signals is coupled, via the circuit design, to the selected clock input of the first one of the number of state devices, thereby resulting in an identified second signal; and c. determining means coupled to said first and second identifying means for determining the particular gated clock signal that is uniquely identified by the particular logical combination of the identified first signal and the identified second signal.

22. Apparatus according to claim 21 wherein said first identifying means comprises a first net tracing means for tracing through the circuit design, from the identified first signal to the selected clock input of the first one of the number of state devices.

23. Apparatus according to claim 22 wherein said second identifying means comprises a second net tracing means for tracing through the circuit design, from the identified second signal to the selected clock input of the first one of the number of state devices.

24. Apparatus according to claim 21 wherein said first identifying means comprises a first net tracing means for tracing through the circuit design, from the selected clock input of the first one of the number of state devices back to the identified first signal.

25. Apparatus according to claim 24 wherein said second identifying means comprises a second net tracing means for tracing through the circuit design, from the selected clock input of the first one of the number of state devices back to the identified second signal.

26. A method for determining which of a number of gated clock signals control a selected one of a number of state devices within a circuit design, wherein each of the number of gated clock signals is uniquely determined by a particular combination of a number of first signals and a number of second signals, the method comprising the steps of:

a. identifying which of the number of first signals is coupled, through combinational logic, to the selected one of the number of state devices, thereby resulting in an identified first signal;

b. identifying which of the number of second signals is coupled, through combinational logic, to the selected one of the number of state devices, thereby resulting in an identified second signal; and c. determining which of the number of gated clock signals corresponds to the particular combination of the identified first signal and the identified second signal.

27. A method according to claim 26 wherein said identifying step (a) comprises tracing the number of first signals through the circuit design to corresponding ones of the number of state devices, including the selected one of the number of state devices.

28. A method according to claim 27 wherein said identifying step (b) comprises tracing the number of second signals through the circuit design to corresponding ones of the number of state devices, including the selected one of the number of state devices.

29. A method according to claim 26 further comprising a recording step for recording each of the number of state devices that correspond to each of the number of first signals.

30. A method according to claim 29 further comprising a recording step for recording each of the number of state devices that correspond to each of the number of second signals.

31. A method according to claim 26 wherein the number of first signals and the number of second signals are selectively combined using a logic gate to provide the number of gated clock signals.

32. A method according to claim 31 wherein said logic gate comprises an AND gate.

33. A method according to claim 26 wherein the number of first signals comprises a number of raw clock signals.

34. A method according to claim 33 wherein the number of second signals comprises a number of enable signals.

35. A method according to claim 26 wherein each of said number of raw clock signals are distributed through the circuit design via a clock tree.

36. Apparatus according to claim 26 wherein said number of enable signals are driven through the circuit design via combinational logic that is routed via an automatic place and route tool.

37. A method according to claim 26 wherein said identifying step (a) and said identifying step (b) are provided by a logic optimization tool.

38. A method according to claim 26 further comprising a notifying step for notifying said logic optimization tool of the particular gated clock signal that is associated with the selected one of the number of state devices.

39. A method for determining which of a number of gated clock signals control a selected one of a number of state devices within a circuit design, wherein each of the number of gated clock signals is uniquely generated by selectively combining a number of first signals and a number of second signals, the method comprising the steps of:

a. tracing each of the number of first signals to corresponding ones of the number of state devices, thereby determining an identified one of the number of first signals that corresponds to the selected one of the number of state devices;

b. recording the correspondence between the identified one of the number of first signals and the selected one of the number of state devices;

c. tracing each of the number of second signals to corresponding ones of the number of state devices, thereby determining an identified one of the number of second signals that corresponds to the selected one of the number of state devices;

d. recording the correspondence between the identified one of the number of second signals and the selected one of the number of state devices; and e. selecting one of the number of gated clock signals by determining which of the number of gated clock signals is uniquely determined by the combination of the identified one of the number of first signals and the identified one of the number of second signals.

40. A method according to claim 39 further comprising the step of:

f. notifying a logic optimization tool of the selected one of the number of gated clock signals that corresponds to the selected one of the number of state devices.

41. A method according to claim 40 wherein the selected one of the number of gated clock signals has a number of predetermined characteristics.

42. A method according to claim 41 wherein said logic optimization tool applies a clock waveform to the selected one of the number of state devices in accordance with the number of predefined characteristics of the selected one of the number of gated clock signals.

43. A method for determining which of a number of gated clock signals control a selected one of a number of state devices within a circuit design, wherein each of the number of gated clock signals is uniquely generated by selectively combining a number of first signals and a number of second signals, the method comprising the steps of:

a. identifying which of the number of state devices are coupled, via the circuit design, to which of the number of first signals, thereby resulting in a correspondence between the number of first signals and the number of state devices;

b. identifying which of the number of state devices are coupled, via the circuit design, to which of the number of second signals, thereby resulting in a correspondence between the number of second signals and the number of state devices;

c. determining which of the number of state devices correspond to both a first signal and a second signal, thereby resulting in a number of common state devices;

d. associating the number of common state devices with both the corresponding first signal and the corresponding second signal; and e. assigning to each of the number of common state devices a particular one of the number of gated clock signals, wherein the particular gated clock signal assigned is uniquely determined by the particular combination of the associated first and second signals.

44. A method according to claim 43 wherein said identifying step (a) comprises tracing through the circuit design, from the identified first signal to the selected clock input of the first one of the number of state devices.

45. A method according to claim 43 wherein said identifying step (a) comprises tracing through the circuit design, from the selected clock input of the first one of the number of state devices back to the identified first signal.

46. A method according to claim 43 wherein said identifying step (b) comprises tracing through the circuit design, from the identified second signal to the selected clock input of the first one of the number of state devices.

47. A method according to claim 43 wherein said identifying step (b) comprises tracing through the circuit design, from the selected clock input of the first one of the number of state devices back to the identified second signal.

48. A method for determining which of a number of gated clock signals control a selected one of a number of state devices within a circuit design, wherein each of the number of gated clock signals is uniquely determined by the particular combination of a first signal and a second signal, the method comprising the steps of:

a. tracing the number of first signals, through the circuit design, to the number of state devices;

b. determining which of the number of first signals correspond to each of the number of state devices;

c. recording the correspondence between the number of first signals and the number of state devices as a number of entries in a clock definition file;
d. tracing the number of second signals, through the circuit design, to the number of state devices;
e. determining which of the number of second signals correspond to each of the number of state devices;
f. recording the correspondence between the number of second signals and the number of state devices as a number of entries in the clock definition file;
g. determining which of the state devices have multiple corresponding entries in the clock definition file, thereby indicating the state devices that are controlled by a gate clock signal;
h. identifying which of the first signals and which of the second signals correspond to each of the state devices determined in step (g); and
i. assigning the one of the number of gated clock signals that is uniquely determined by the combination of the first signal and the second signal identified in step (h), to each of the state devices.

* * * * *